(12) United States Patent
Liu et al.

(10) Patent No.: US 11,196,159 B2
(45) Date of Patent: Dec. 7, 2021

(54) SWITCH LINEARIZATION BY COMPENSATION OF A FIELD-EFFECT TRANSISTOR

(71) Applicant: SKYWORKS SOLUTIONS, INC., Woburn, MA (US)

(72) Inventors: Zhiyang Liu, Dunstable, MA (US); Nuttapong Srirattana, Billerica, MA (US)

(73) Assignee: Skyworks Solutions, Inc., Irvine, CA (US)

(*) Notice: Subject to any disclaimer, the term of this patent is extended or adjusted under 35 U.S.C. 154(b) by 458 days.

(21) Appl. No.: 15/788,789

(22) Filed: Oct. 19, 2017

(65) Prior Publication Data

US 2018/0108988 A1   Apr. 19, 2018

Related U.S. Application Data

(60) Provisional application No. 62/410,367, filed on Oct. 19, 2016.

(51) Int. Cl.
| | | |
|---|---|---|
| *H01Q 3/24* | (2006.01) | |
| *H03K 17/687* | (2006.01) | |
| *H03K 17/567* | (2006.01) | |
| *H03K 17/14* | (2006.01) | |
| *H03K 17/74* | (2006.01) | |
| *H04B 1/00* | (2006.01) | |
| *H03K 17/693* | (2006.01) | |
| *H04B 1/48* | (2006.01) | |

(52) U.S. Cl.
CPC ........... *H01Q 3/247* (2013.01); *H03K 17/145* (2013.01); *H03K 17/567* (2013.01); *H03K 17/687* (2013.01); *H03K 17/693* (2013.01); *H04B 1/00* (2013.01); *H04B 1/48* (2013.01); *H03K 17/74* (2013.01); *H03K 2217/9401* (2013.01)

(58) Field of Classification Search
CPC .. H03K 17/145; H03K 17/567; H03K 17/687; H03K 17/6871; H03K 17/6872; H03K 17/6874; H03K 17/6877; H03K 17/689; H03K 17/6895; H03K 17/691; H03K 17/693; H03K 2017/6875; H03K 2017/6878; H03K 17/74; H03K 17/76; H03K 2217/9401; H03K 2217/94015; H03K 2217/94021; H03K 2217/94026; H03K 2217/94031; H04B 1/44; H04B 1/46; H04B 1/48; H01Q 3/247
See application file for complete search history.

(56) References Cited

U.S. PATENT DOCUMENTS 7,605,570 B2 * 10/2009 Liu .................... H02M 1/4225
                                                              323/207
9,571,035 B1 *  2/2017 Convert ................. H03D 7/02
(Continued)

*Primary Examiner* — Patrick C Chen
(74) *Attorney, Agent, or Firm* — Chang & Hale LLP

(57) ABSTRACT

A radio-frequency switch is disclosed, comprising a set of field-effect transistors disposed between a first node and a second node. In some embodiments, each field-effect transistor of the set of field-effect transistors has a respective source, drain, gate, and body. In some embodiments, the radio-frequency switch includes a compensation circuit coupled in parallel with the set of field-effect transistors, the compensation circuit configured to compensate a non-linearity effect generated by the set of field-effect transistors.

18 Claims, 15 Drawing Sheets

(56) References Cited

U.S. PATENT DOCUMENTS

| | | | |
|---|---|---|---|
| 10,447,344 B2* | 10/2019 | Scott | H03K 17/04123 |
| 2010/0308932 A1* | 12/2010 | Rangarajan | H03B 5/1206 |
| | | | 331/167 |
| 2014/0009214 A1* | 1/2014 | Altunkilic | H03K 17/161 |
| | | | 327/427 |
| 2014/0266383 A1* | 9/2014 | Lu | H03G 7/004 |
| | | | 327/328 |
| 2014/0335801 A1* | 11/2014 | Bolton | H04B 15/02 |
| | | | 455/83 |
| 2015/0249876 A1* | 9/2015 | Hogan | H04R 1/1041 |
| | | | 381/123 |
| 2015/0318829 A1* | 11/2015 | Astgimath | H03F 1/26 |
| | | | 381/120 |
| 2017/0201245 A1* | 7/2017 | Scott | H03K 17/04123 |

* cited by examiner

SWITCH LINEARIZATION BY COMPENSATION OF A FIELD-EFFECT TRANSISTOR

CROSS-REFERENCE TO RELATED APPLICATION(S)

This application claims priority to U.S. Provisional Application No. 62/410,367 filed Oct. 19, 2016, entitled SWITCH LINEARIZATION BY COMPENSATION OF A FIELD-EFFECT TRANSISTOR, the disclosure of which is hereby expressly incorporated by reference herein in its entirety. This application also incorporates by reference in its entirety, U.S. Pat. No. 9,160,328 issued on Oct. 13, 2015, entitled CIRCUITS, DEVICES, METHODS AND APPLICATIONS RELATED TO SILICON-ON-INSULATOR BASED RADIO-FREQUENCY SWITCHES.

BACKGROUND

Field

The present disclosure generally relates to radio-frequency switches.

Description of the Related Art

Demands are increasing in semiconductor and electronics devices to support radio-frequency applications with high linearity in the transmission of RF signals. Switches used in the amplification and/or transmission of RF signals may experience nonlinearity, leading to harmonic distortion in an output signal of a communication system. A need exists to reduce or eliminate such nonlinearity and subsequent harmonic distortion, while keeping the size and cost of such switches low.

SUMMARY

In accordance with some implementations, the present disclosure relates to a radio-frequency switch comprising a set of field-effect transistors disposed between a first node and a second node, each field-effect transistor of the set of field-effect transistors having a respective source, drain, gate, and body. The radio-frequency switch further comprises a compensation circuit coupled in parallel with the set of field-effect transistors, the compensation circuit configured to compensate (or compensate for) a non-linearity effect generated by the set of field-effect transistors.

In some embodiments, the compensation circuit comprises a first set of diodes and a second set of diodes, the first set of diodes being coupled antiparallel to a second set of diodes. In some embodiments, the compensation circuit comprises a first capacitor coupled in series to the first set of diodes and comprises a second capacitor coupled in series to the second set of diodes.

In some embodiments, the compensation circuit comprises a first set of switches coupled in series to the first capacitor and the first set of diodes and comprises a second set of switches coupled in series to the second capacitor and the second set of diodes. In some embodiments, the compensation circuit comprises a first switch coupled to the first set of diodes and the second set of diodes.

In some embodiments, the first switch is configured to be selectively coupled to a current source or a negative voltage generator. In some embodiments, the compensation circuit is coupled to a control component configured to control operation of the first switch.

In some embodiments, the control component is configured to couple the first switch to the current source when the set of field-effect transistors are in an ON state. In some embodiments, the control component is configured to couple the first switch to the negative voltage generator when the set of field-effect transistors are in an OFF state.

In some embodiments, the compensation circuit is coupled to a control component configured to control operation of the first set of switches and the second set of switches. In some embodiments, the control component is configured to turn the first set of switches and the second set of switches ON when the set of field-effect transistors are in an ON state. In some embodiments, the control component is configured to turn the first set of switches and the second set of switches OFF when the set of field-effect transistors are in an OFF state.

In some embodiments, the radio-frequency switch further comprises one or more resistances coupled to the first set of diodes, the second set of diodes, and the first switch.

In some embodiments, the compensation circuit comprises a first end coupled between the first node and the set of field-effect transistors and a second end coupled between the second node and the set of field-effect transistors. In some embodiments, the first set of switches is coupled to the first end and wherein the second set of switches is coupled to the second end.

In some embodiments, the first node is configured to receive an radio-frequency signal having a power value and the second node is configured to output the radio-frequency signal when the set of field-effect transistors are in an ON state. In some embodiments, the set of field-effect transistors comprises N of field-effect transistors connected in series, the quantity N selected to allow the radio-frequency switch to handle a power of the radio-frequency signal.

In some embodiments, the set of field-effect transistors comprise silicon-on-insulator (SOI) set of field-effect transistors. In some embodiments, the compensation circuit is configured to compensate (or compensate for) the non-linearity effect by generating harmonics to compensate (or compensate for) the non-linearity effect.

In accordance with some implementations, the present disclosure relates to a method for operating a radio-frequency (RF) switch comprising controlling a set of field-effect transistors disposed between a first node and second node so that the set of field-effect transistors are in an ON state or an OFF state and generating one or more harmonics to compensate (or compensate for) a non-linear effect of the set of field-effect transistors when the set of field-effect transistors are in the ON state.

In some embodiments, generating the one or more harmonics comprises coupling a first set of diodes and a second set of diodes of a compensation circuit to a current source.

In some embodiments, the method further comprises refraining from generating the one or more harmonics when the set of field-effect transistors are in the OFF state. In some embodiments, refraining from generating the one or more harmonics comprises coupling a first set of diodes and a second set of diodes of a compensation circuit to a negative voltage generator.

In accordance with some implementations, the present disclosure relates to a semiconductor die comprising a semiconductor substrate, a set of field-effect transistors formed on the semiconductor substrate, and a compensation circuit coupled in parallel with the set of field-effect transistors, the compensation circuit configured to compensate (or compensate for) a non-linearity effect generated by the set of field-effect transistors. In some embodiments, the semiconductor die further comprises an insulator layer disposed between the set of field-effect transistors and the semiconductor substrate. In some embodiments, the semiconductor die is a silicon-on-insulator die.

In accordance with some implementations, the present disclosure relates to a method for fabricating a semiconductor die comprising providing a semiconductor substrate, forming a set of field-effect transistors on the semiconductor substrate, each field-effect transistor in the set of field-effect transistors having a respective source, drain, gate, and body, forming a compensation circuit on the semiconductor substrate, and connecting the compensation circuit to the set of field-effect transistors in parallel, the compensation circuit configured to compensate (or compensate for) a non-linearity effect generated by the set of field-effect transistors. In some embodiments, the method further comprises forming an insulator layer between the set of field-effect transistors and the semiconductor substrate.

In accordance with some implementations, the present disclosure relates to a radio-frequency switch module comprising a packaging substrate configured to receive a plurality of components, a semiconductor die mounted on the packaging substrate, the semiconductor die including a set of field-effect transistors and a compensation circuit coupled in parallel with the set of field-effect transistors, the compensation circuit configured to compensate (or compensate for) a non-linearity effect generated by the set of field-effect transistors.

In accordance with some implementations, the present disclosure relates to a wireless device comprising a transceiver configured to process RF signals, an antenna in communication with the transceiver configured to facilitate transmission of an amplified RF signal, a power amplifier connected to the transceiver and configured to generate the amplified RF signal and a switch connected to the antenna and the power amplifier and configured to selectively route the amplified RF signal to the antenna, the switch including a set of field-effect transistors, the switch further including a compensation circuit coupled in parallel with the set of field-effect transistors, the compensation circuit configured to compensate (or compensate for) a non-linearity effect generated by the set of field-effect transistors.

The present disclosure generally relates to the field of electronics, and more particularly, to radio-frequency switches.

DETAILED DESCRIPTION OF SOME EMBODIMENTS

The headings provided herein, if any, are for convenience only and do not necessarily affect the scope or meaning of the claimed invention.

The present disclosure generally relates to the field of electronics, and more particularly, to radio-frequency switches.

Radio-frequency (RF) switches, such as transistor switches, can be used to switch signals between one or more poles and one or more throws. Transistor switches, or portions thereof, can be controlled through transistor biasing and/or coupling. Design and use of bias and/or coupling circuits in connection with RF switches can affect switching performance.

Figure 1:
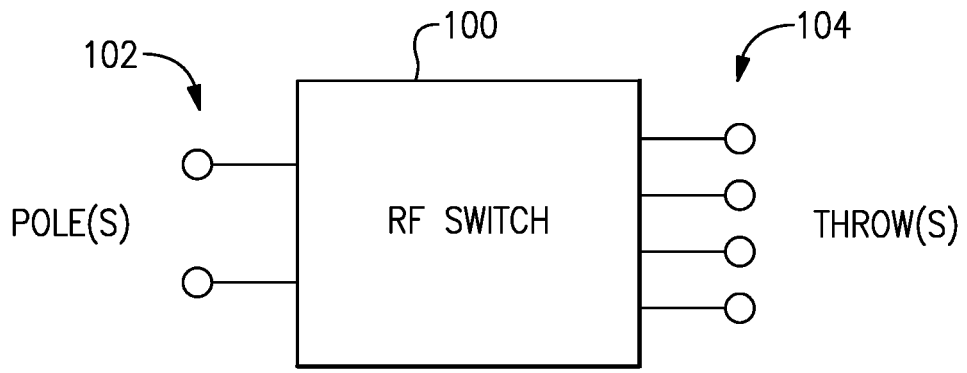
FIG. 1 shows a block diagram representation of a radio-frequency switch in accordance with some embodiments.

Example Components of a Switching Device:

FIG. 1 schematically shows a radio-frequency (RF) switch 100 configured to switch one or more signals between one or more poles 102 and one or more throws 104. In some embodiments, such a switch can be based on one or more field-effect transistors (FETs) such as silicon-on-insulator (SOI) FETs. When a particular pole is connected to a particular throw, such a path is commonly referred to as being closed or in an ON state. When a given path between a pole and a throw is not connected, such a path is commonly referred to as being open or in an OFF state.

Figure 2:
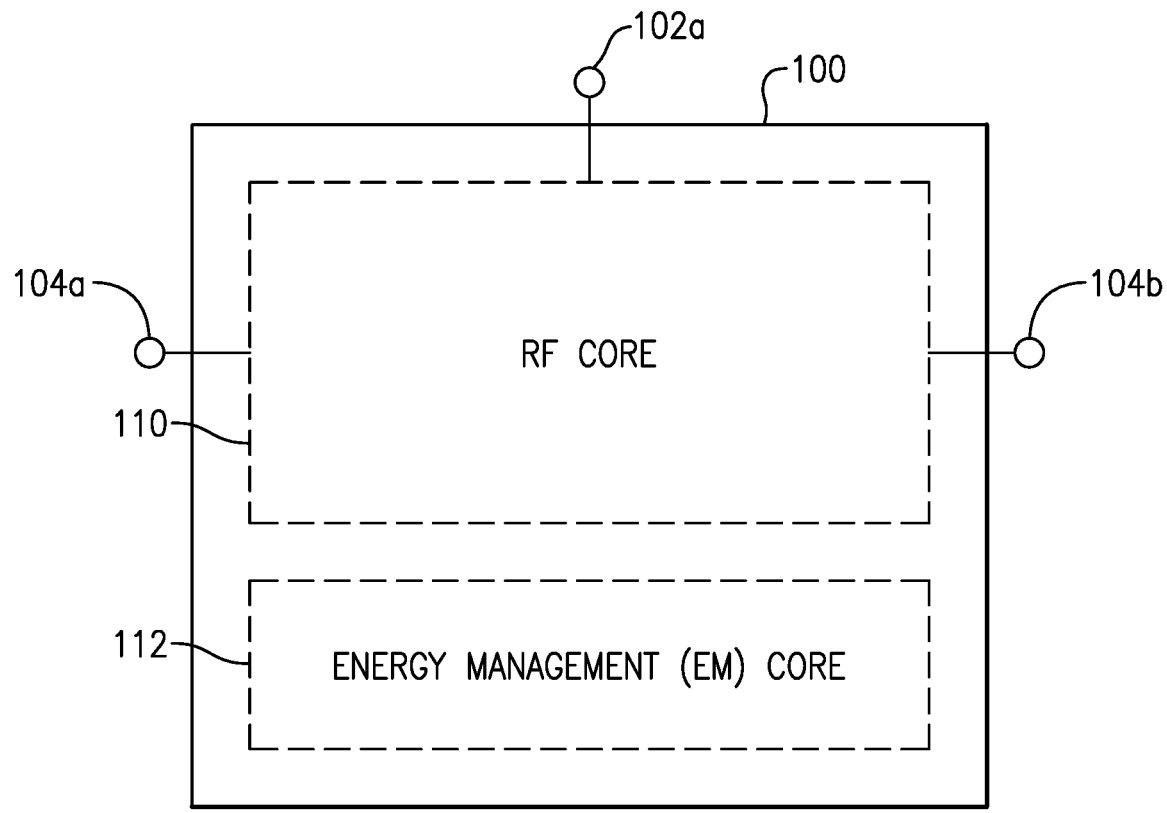
FIG. 2 shows a block diagram representation of a radio-frequency switch with an RF core and an EM core, in accordance with some embodiments.

FIG. 2 shows that in some implementations, the RF switch 100 of FIG. 1 can include an RF core 110 and an energy management (EM) core 112. The RF core 110 can be configured to route RF signals between the first and second ports. In the example single-pole-double-throw (SPDT) configuration shown in FIG. 2, such first and second ports can include a pole 102a and a first throw 104a, or the pole 102a and a second throw 104b.

In some embodiments, EM core 112 can be configured to supply, for example, voltage control signals to the RF core. The EM core 112 can be further configured to provide the RF switch 100 with logic decoding and/or power supply conditioning capabilities.

In some embodiments, the RF core 110 can include one or more poles and one or more throws to enable passage of RF signals between one or more inputs and one or more outputs of the switch 100. For example, the RF core 110 can include a single-pole double-throw (SPDT or SP2T) configuration as shown in FIG. 2.

Figure 3:
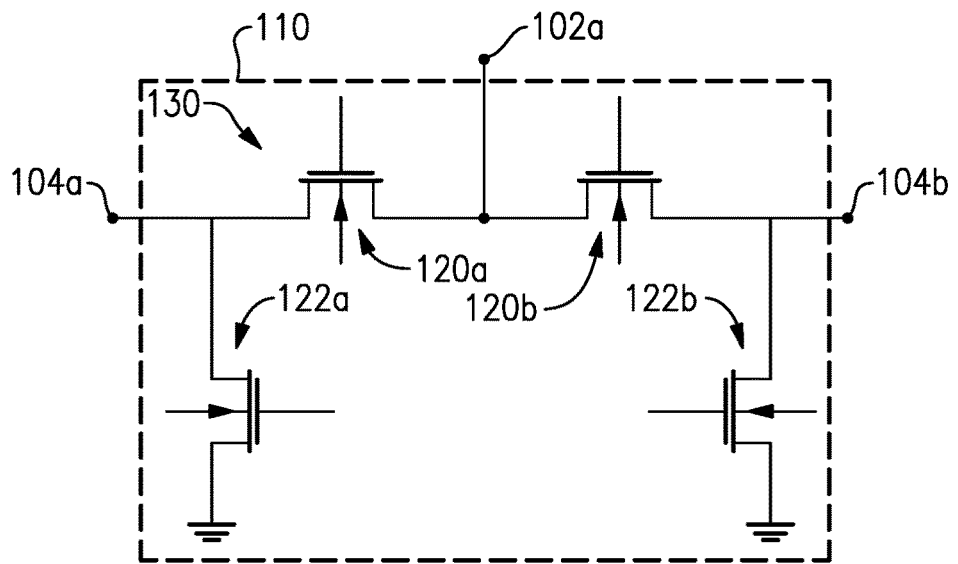
FIG. 3 shows a schematic representation of an RF core, in accordance with some embodiments.

In the example SPDT context, FIG. 3 shows a more detailed example configuration of an RF core 110. The RF core 110 is shown to include a single pole 102a coupled to first and second throw nodes 104a, 104b via first and second transistors (e.g., FETs) 120a, 120b. The first throw node 104a is shown to be coupled to an RF ground via an FET 122a to provide shunting capability for the node 104a. Similarly, the second throw node 104b is shown to be coupled to the RF ground via an FET 122b to provide shunting capability for the node 104b.

In an example operation, when the RF core 110 is in a state where an RF signal is being passed between the pole 102a and the first throw 104a, the FET 120a between the pole 102a and the first throw node 104a can be in an ON state, and the FET 120b between the pole 102a and the second throw node 104b can be in an OFF state. For the shunt FETs 122a, 122b, the shunt FET 122a can be in an OFF state so that the RF signal is not shunted to ground as it travels from the pole 102a to the first throw node 104a. The shunt FET 122b associated with the second throw node 104b can be in an ON state so that any RF signals or noise arriving at the RF core 110 through the second throw node 104b is shunted to the ground so as to reduce undesirable interference effects to the pole-to-first-throw operation.

Although the foregoing example is described in the context of a single-pole-double-throw configuration, it will be understood that the RF core can be configured with other numbers of poles and throws. For example, there may be more than one poles, and the number of throws can be less than or greater than the example number of two.

In the example of FIG. 3, the transistors between the pole 102a and the two throw nodes 104a, 104b are depicted as single transistors. In some implementations, such switching functionalities between the pole(s) and the throw(s) can be provided by switch arm segments, where each switch arm segment includes a plurality of transistors such as FETs.

Figure 4:
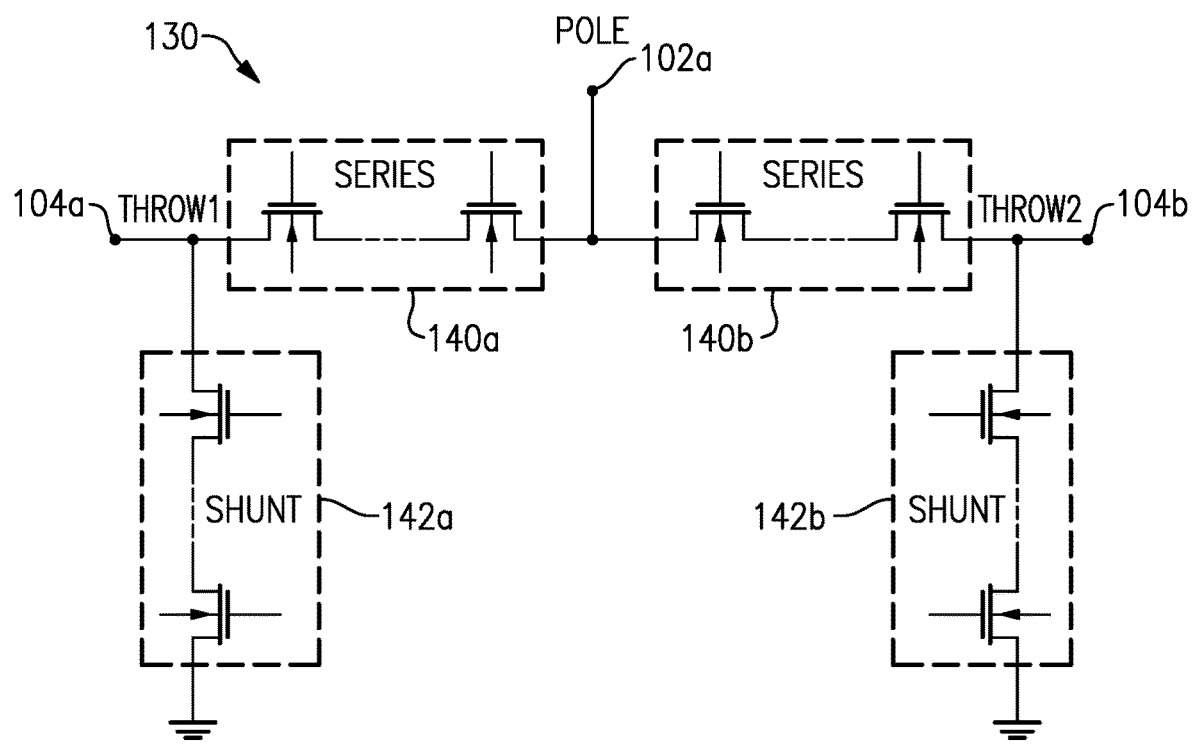
FIG. 4 shows a schematic representation of an RF core having switch arm segments, in accordance with some embodiments.

An example RF core configuration 130 of an RF core having such switch arm segments is shown in FIG. 4. In the example, the pole 102a and the first throw node 104a are shown to be coupled via a first switch arm segment 140a. Similarly, the pole 102a and the second throw node 104b are shown to be coupled via a second switch arm segment 140b. The first throw node 104a is shown to be capable of being shunted to an RF ground via a first shunt arm segment 142a. Similarly, the second throw node 104b is shown to be capable of being shunted to the RF ground via a second shunt arm segment 142b.

In an example operation, when the RF core 130 is in a state where an RF signal is being passed between the pole 102a and the first throw node 104a, all of the FETs in the first switch arm segment 140a can be in an ON state, and all of the FETs in the second switch arm segment 104b can be in an OFF state. The first shunt arm 142a for the first throw node 104a can have all of its FETs in an OFF state so that the RF signal is not shunted to ground as it travels from the pole 102a to the first throw node 104a. All of the FETs in the second shunt arm 142b associated with the second throw node 104b can be in an ON state so that any RF signals or noise arriving at the RF core 130 through the second throw node 104b is shunted to the ground so as to reduce undesirable interference effects to the pole-to-first-throw operation.

Again, although described in the context of an SP2T configuration, it will be understood that RF cores having other numbers of poles and throws can also be implemented.

In some implementations, a switch arm segment (e.g., 140a, 140b, 142a, 142b) can include one or more semiconductor transistors such as FETs. In some embodiments, an FET may be capable of being in a first state or a second state and can include a gate, a drain, a source, and a body (sometimes also referred to as a substrate). In some embodiments, an FET can include a metal-oxide-semiconductor field effect transistor (MOSFET). In some embodiments, one or more FETs can be connected in series forming a first end and a second end such that an RF signal can be routed between the first end and the second end when the FETs are in a first state (e.g., ON state).

Figure 5:
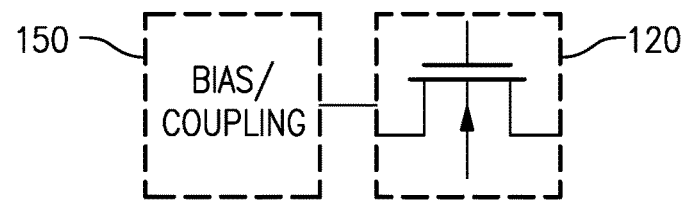
FIG. 5 shows a schematic representation of control of a FET facilitated by a bias/coupling circuit, in accordance with some embodiments.

At least some of the present disclosure relates to how an FET or a group of FETs can be controlled to provide switching functionalities in desirable manners. FIG. 5 schematically shows that in some implementations, such controlling of an FET 120 can be facilitated by a circuit 150 configured to bias and/or couple one or more portions of the FET 120. In some embodiments, such a circuit 150 can include one or more circuits configured to bias and/or couple a gate of the FET 120, bias and/or couple a body of the FET 120, and/or couple a source/drain of the FET 120.

Figure 6:
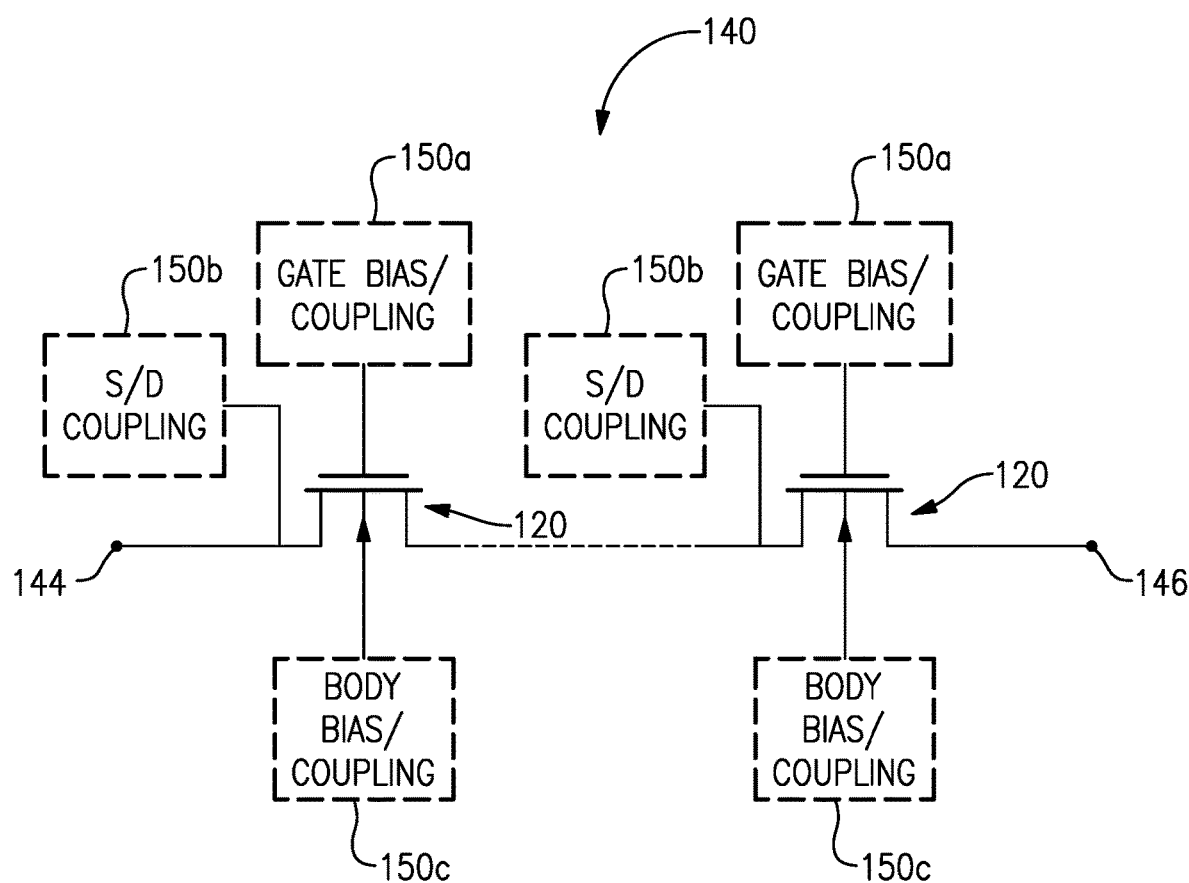
FIG. 6 shows a schematic representation of one or more circuits configured to facilitate control of one or more FETs, in accordance with some embodiments.

Schematic examples of how such biasing and/or coupling of different parts of one or more FETs are described in reference to FIG. 6. In FIG. 6, a switch arm segment 140 (that can be, for example, one of the example switch arm segments 140a, 140b, 142a, 142b of the example of FIG. 4) between nodes 144, 146 is shown to include a plurality of FETs 120. Operations of such FETs can be controlled and/or facilitated by a gate bias/coupling circuit 150a, and a body bias/coupling circuit 150c, and/or a source/drain coupling circuit 150b.

Gate Bias/Coupling Circuit

In the example shown in FIG. 6, the gate of each of the FETs 120 can be connected to the gate bias/coupling circuit 150a to receive a gate bias signal and/or couple the gate to another part of the FET 120 or the switch arm 140. In some implementations, designs or features of the gate bias/coupling circuit 150a can improve performance of the switch arm 140. Such improvements in performance can include, but are not limited to, device insertion loss, isolation performance, power handling capability and/or switching device linearity. Example gate bias/coupling circuits are discussed in more detail in U.S. Pat. No. 9,160,328.

Body Bias/Coupling Circuit

As shown in FIG. 6, the body of each FET 120 can be connected to the body bias/coupling circuit 150c to receive a body bias signal and/or couple the body to another part of the FET 120 or the switch arm 140. In some implementations, designs or features of the body bias/coupling circuit 150c can improve performance of the switch arm 140. Such improvements in performance can include, but are not limited to, device insertion loss, isolation performance, power handling capability and/or switching device linearity. Example body bias/coupling circuits are discussed in more detail in U.S. Pat. No. 9,160,328.

Source/Drain Coupling Circuit

As shown in FIG. 6, the source/drain of each FET 120 can be connected to the coupling circuit 150b to couple the source/drain to another part of the FET 120 or the switch arm 140. In some implementations, designs or features of the coupling circuit 150b can improve performance of the switch arm 140. Such improvements in performance can include, but are not limited to, device insertion loss, isolation performance, power handling capability and/or switching device linearity. Example coupling circuits are discussed in more detail in U.S. Pat. No. 9,160,328.

Examples of Switching Performance Parameters:

Insertion Loss

A switching device performance parameter can include a measure of insertion loss. A switching device insertion loss can be a measure of the attenuation of an RF signal that is routed through the RF switching device. For example, the magnitude of an RF signal at an output port of a switching device can be less than the magnitude of the RF signal at an input port of the switching device. In some embodiments, a switching device can include device components that introduce parasitic capacitance, inductance, resistance, or conductance into the device, contributing to increased switching device insertion loss. In some embodiments, a switching device insertion loss can be measured as a ratio of the power or voltage of an RF signal at an input port to the power or voltage of the RF signal at an output port of the switching device. Decreased switching device insertion loss can be desirable to enable improved RF signal transmission.

Isolation

A switching device performance parameter can also include a measure of isolation. Switching device isolation can be a measure of the RF isolation between an input port and an output port an RF switching device. In some embodiments, it can be a measure of the RF isolation of a switching device while the switching device is in a state where an input port and an output port are electrically isolated, for example while the switching device is in an OFF state. Increased switching device isolation can improve RF signal integrity. In certain embodiments, an increase in isolation can improve wireless communication device performance.

Intermodulation Distortion

A switching device performance parameter can further include a measure of intermodulation distortion (IMD) performance. Intermodulation distortion (IMD) can be a measure of non-linearity in an RF switching device.

IMD can result from two or more signals mixing together and yielding frequencies that are not harmonic frequencies. For example, suppose that two signals have fundamental frequencies $f_1$ and $f_2$ ($f_2 > f_1$) that are relatively close to each other in frequency space. Mixing of such signals can result in peaks in frequency spectrum at frequencies corresponding to different products of fundamental and harmonic frequencies of the two signals. For example, a second-order intermodulation distortion (also referred to as IMD2) is typically considered to include frequencies $f_1+f_2$, $f_2-f_1$, $2f_1$, and $2f_2$. A third-order IMD (also referred to as IMD3) is typically considered to include $2f_1+f_2$, $2f_1-f_2$, $f_1+2f_2$, $f_1-2f_2$. Higher order products can be formed in similar manners.

In general, as the IMD order number increases, power levels decrease. Accordingly, second and third orders can be undesirable effects that are of particular interest. Higher orders such as fourth and fifth orders can also be of interest in some situations.

In some RF applications, it can be desirable to reduce susceptibility to interference within an RF system. Non linearity in RF systems can result in introduction of spurious signals into the system. Spurious signals in the RF system can result in interference within the system and degrade the information transmitted by RF signals. An RF system having increased non-linearity can demonstrate increased susceptibility to interference. Non-linearity in system components, for example switching devices, can contribute to the introduction of spurious signals into the RF system, thereby contributing to degradation of overall RF system linearity and IMD performance.

In some embodiments, RF switching devices can be implemented as part of an RF system including a wireless communication system. IMD performance of the system can be improved by increasing linearity of system components, such as linearity of an RF switching device. In some embodiments, a wireless communication system can operate in a multi-band and/or multi-mode environment. Improvement in intermodulation distortion (IMD) performance can be desirable in wireless communication systems operating in a multi-band and/or multi-mode environment. In some embodiments, improvement of a switching device IMD performance can improve the IMD performance of a wireless communication system operating in a multi-mode and/or multi-band environment.

Improved switching device IMD performance can be desirable for wireless communication devices operating in various wireless communication standards, for example for wireless communication devices operating in the LTE communication standard. In some RF applications, it can be desirable to improve linearity of switching devices operating in wireless communication devices that enable simultaneous transmission of data and voice communication. For example, improved IMD performance in switching devices can be desirable for wireless communication devices operating in the LTE communication standard and performing simultaneous transmission of voice and data communication (e.g., SVLTE).

High Power Handling Capability

In some RF applications, it can be desirable for RF switching devices to operate under high power while reducing degradation of other device performance parameters. In some embodiments, it can be desirable for RF switching devices to operate under high power with improved intermodulation distortion, insertion loss, and/or isolation performance.

In some embodiments, an increased number of transistors can be implemented in a switch arm segment of a switching device to enable improved power handling capability of the switching device. For example, a switch arm segment can include an increased number of FETs connected in series, an increased FET stack height, to enable improved device performance under high power. However, in some embodiments, increased FET stack height can degrade the switching device insertion loss performance.

Examples of FET Structures and Fabrication Process Technologies:

A switching device can be implemented on-die, off-die, or some combination thereon. A switching device can also be fabricated using various technologies. In some embodiments, RF switching devices can be fabricated with silicon or silicon-on-insulator (SOI) technology.

As described herein, an RF switching device can be implemented using silicon-on-insulator (SOI) technology. In some embodiments, SOI technology can include a semiconductor substrate having an embedded layer of electrically insulating material, such as a buried oxide layer beneath a silicon device layer. For example, an SOI substrate can include an oxide layer embedded below a silicon layer. Other insulating materials known in the art can also be used.

Implementation of RF applications, such as an RF switching device, using SOI technology can improve switching device performance. In some embodiments, SOI technology can enable reduced power consumption. Reduced power consumption can be desirable in RF applications, including those associated with wireless communication devices. SOI technology can enable reduced power consumption of device circuitry due to decreased parasitic capacitance of transistors and interconnect metallization to a silicon substrate. Presence of a buried oxide layer can also reduce junction capacitance or use of high resistivity substrate, enabling reduced substrate related RF losses. Electrically isolated SOI transistors can facilitate stacking, contributing to decreased chip size.

Figure 7A:
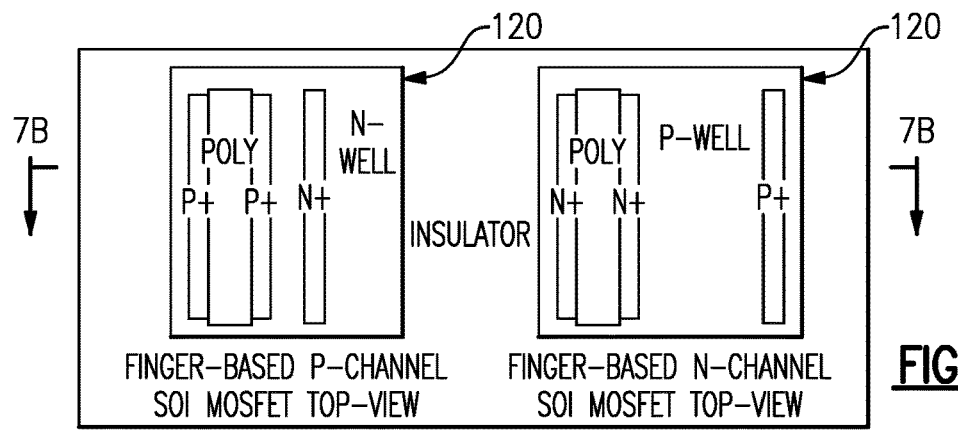
FIG. 7A shows a plan view of an example finger-based FET device implemented on SOI, in accordance with some embodiments.
Figure 7B:
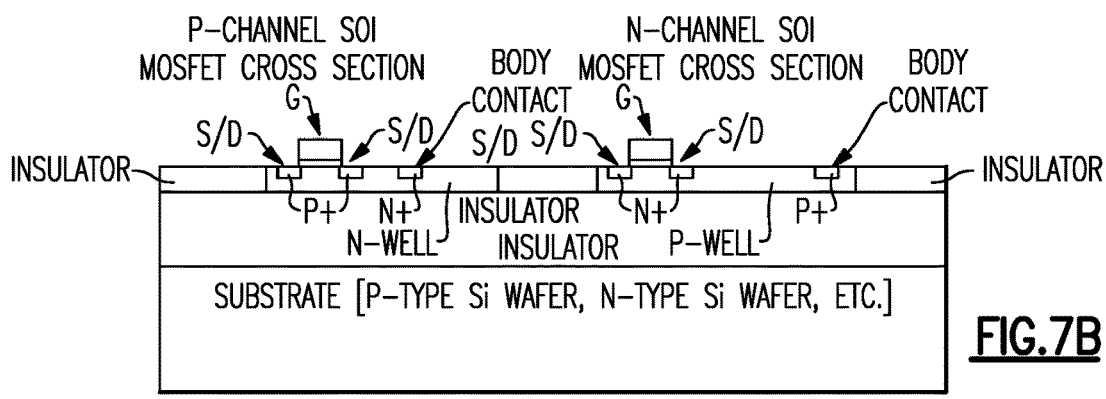
FIG. 7B shows a side sectional view of an example finger-based FET device implemented on SOI, in accordance with some embodiments.

In some SOI FET configurations, each transistor can be configured as a finger-based device where the source and drain are rectangular shaped (in a plan view) and a gate structure extends between the source and drain like a rectangular shaped finger. FIGS. 7A and 7B show plan and side sectional views of an example finger-based FET device implemented on SOI. As shown, FET devices described herein can include a p-type FET or an n-type FET. Thus, although some FET devices are described herein as p-type devices, it will be understood that various concepts associated with such p-type devices can also apply to n-type devices.

As shown in FIGS. 7A and 7B, a pMOSFET can include an insulator layer formed on a semiconductor substrate. The insulator layer can be formed from materials such as silicon dioxide or sapphire. An n-well is shown to be formed in the insulator such that the exposed surface generally defines a rectangular region. Source (S) and drain (D) are shown to be p-doped regions whose exposed surfaces generally define rectangles. As shown, S/D regions can be configured so that source and drain functionalities are reversed.

FIGS. 7A and 7B further show that a gate (G) can be formed on the n-well so as to be positioned between the source and the drain. The example gate is depicted as having a rectangular shape that extends along with the source and the drain. Also shown is an n-type body contact. Formations of the rectangular shaped well, source and drain regions, and the body contact can be achieved by a number of known techniques. In some embodiments, the source and drain regions can be formed adjacent to the ends of their respective upper insulator layers, and the junctions between the body and the source/drain regions on the opposing sides of the body can extend substantially all the way down to the top of the buried insulator layer. Such a configuration can provide, for example, reduced source/drain junction capacitance. To form a body contact for such a configuration, an additional gate region can be provided on the side so as to allow, for example, an isolated P+ region to contact the Pwell.

Figure 8A:
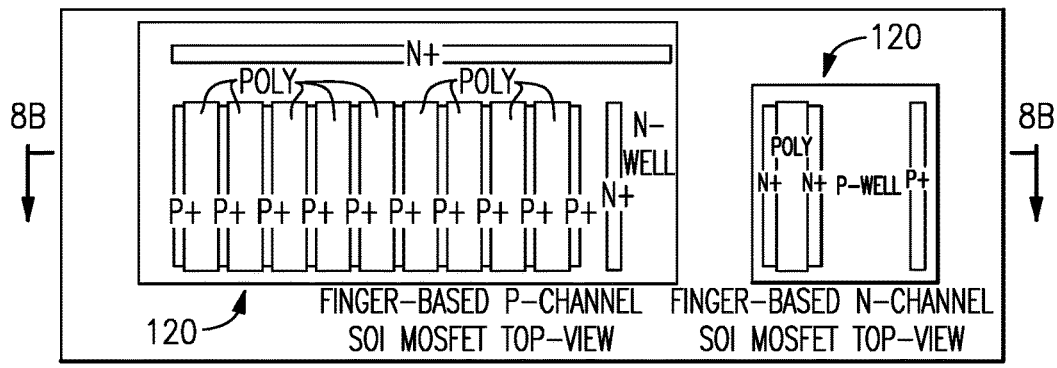
FIG. 8A shows a plan view of an example multiple-finger-based FET device implemented on SOI, in accordance with some embodiments.
Figure 8B:
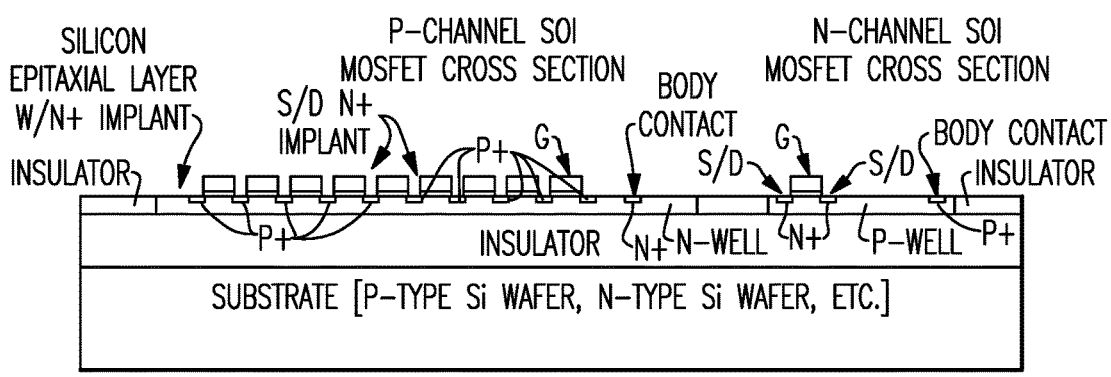
FIG. 8B shows a side sectional view of an example multiple-finger-based FET device implemented on SOI, in accordance with some embodiments.

FIGS. 8A and 8B show plan and side sectional views of an example of a multiple-finger FET device implemented on SOI. Formations of rectangular shaped n-well, rectangular shaped p-doped regions, rectangular shaped gates, and n-type body contact can be achieved in manners similar to those described in reference to FIGS. 7A and 7B.

The example multiple-finger FET device of FIGS. 8A and 8B can be made to operate such that a drain of one FET acts as a source of its neighboring FET. Thus, the multiple-finger FET device as a whole can provide a voltage-dividing functionality. For example, an RF signal can be provided at one of the outermost p-doped regions (e.g., the leftmost p-doped region); and as the signal passes through the series of FETs, the signal's voltage can be divided among the FETs. In such an example, the rightmost p-doped region can act as an overall drain of the multi-finger FET device.

In some implementations, a plurality of the foregoing multi-finger FET devices can be connected in series as a switch to, for example, further facilitate the voltage-dividing functionality. A number of such multi-finger FET devices can be selected based on, for example, power handling requirement of the switch.

Examples of Bias and/or Coupling Configurations for Improved Performance:

Described herein are various examples of how FET-based switch circuits can be biased and/or coupled to yield one or more performance improvements. In some embodiments, such biasing/coupling configurations can be implemented in SOI FET-based switch circuits. It will be understood that some of the example biasing/coupling configurations can be combined to yield a combination of desirable features that may not be available to the individual configurations. It will also be understood that, although described in the context of RF switching applications, one or more features described herein can also be applied to other circuits and devices that utilize FETs such as SOI FETs.

Example Configuration

In some radio-frequency (RF) applications, it is desirable to utilize switches having high linearity, as well as management of intermodulation distortion (IMD) such as IMD3 and IMD2. Such switch-related performance features can contribute significantly to system-level performance of cellular devices. In the context of silicon-on-oxide (SOI) switches, factors such as substrate-coupling (sometimes also referred to as substrate parasitics) and SOI-process can limit the performance achievable.

Such a limitation in performance of SOI switches can be addressed by extensive substrate crosstalk reduction techniques such as capacitive guard rings, and/or trap rich or deep trench isolation techniques. Such techniques typically have associated with them undesirable features such as being expensive, requiring relatively large areas, and requiring additional process steps. Also, such technique can yield a desirable effect that is limited to an isolation feature.

Figure 9:
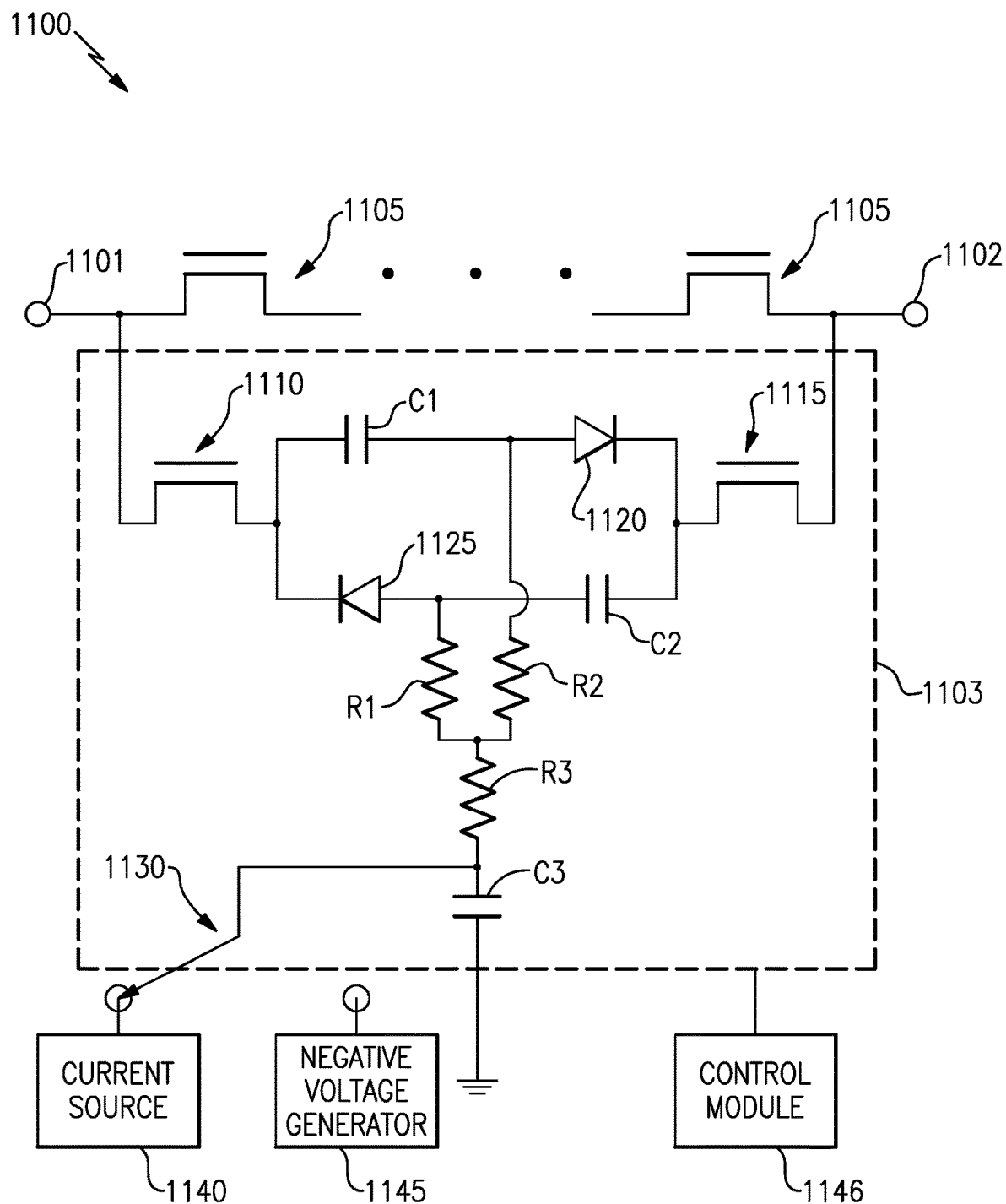
FIG. 9 shows an example of a switch circuit with a compensation circuit, in accordance with some embodiments.

In some implementations, performance of SOI switches can be improved by overcoming or reducing the foregoing effects associated with substrate parasitics and/or process variables. By way of an example, FIG. 9 illustrates an example a switch circuit 1100, according to one embodiment. The switch circuit 1100 may have plurality of FETs 1105 (e.g., a set of FETs) configured to provide switching functionality between a first node 1101 and a second node 1102. In one embodiment, one or more of the FETs 1105 may be SOI FETs. Each FET 1105 may include a gate, a body, a source, and a drain. A gate (e.g., a gate terminal) of a FET 1105 may be biased by a bias voltage (e.g., $V_G$) provided by a gate bias circuit (not illustrated in FIG. 9) which may be coupled to the gate. A body (e.g., a body terminal) of the FET 120 may be biased by a bias voltage $V_B$ provided by a body bias circuit (not illustrated in FIG. 9) which may be coupled to the body. In one embodiment, the first node 1101 may be an input node and may receive a signal, such as an RF signal. The second node 1102 may be an output node and may output the signal (such as an RF signal). The plurality of FETs 1105 may output the signal (received at the from the first node 1101) via the second node 1102 when the plurality of FETs 1105 are in an ON state. The plurality of FETs 1105 may prevent (may stop) a signal (received at the first node 1101) from being outputted via the second node 1102 when the plurality of FETs 1105 are in an OFF state.

As illustrated in FIG. 9, the plurality of FETs 1105 are coupled in parallel with a with a compensation circuit 1103. The compensation circuit includes a diode 1120 coupled antiparallel to a diode 1125. For example, the diodes 1120 and 1125 are coupled in parallel to the switch 1110 and 1115, but the direction of the anode/cathode for the diode 1120 is opposite the direction of the anode/cathode for the diode 1125. The diode 1120 and the diode 1125 may be referred to as antiparallel diodes and/or may be referred to as diodes that are coupled in an antiparallel configuration. The anode of the diode 1120 is coupled in series to a capacitance C1 (e.g., a capacitor) and the capacitance C1 is coupled to a switch 1110 in series. The switch 1110 is also coupled (at a first end of the compensation circuit 1103) to a node/junction that is between the node 1101 and the first FET 1105. The cathode of the diode 1120 is coupled in series to a switch 1115. The anode of the diode 1125 is coupled to a capacitance C2 in series and the capacitance C2 is coupled to the switch 1115 in series. The switch 1115 is also coupled (at a second end of the compensation circuit 1103) to a node/junction that is between the node 1102 and the last FET 1105. The cathode of the diode 1125 is coupled to the switch 1110 in series.

The diodes 1120 and 1125 may be biased by a current (or a voltage) received from the current source 1140 and/or may be biased by a negative voltage received from the negative voltage generator 1145. The diode 1120 may be coupled to the current source 1140 and/or the negative voltage generator 1145 via a resistance R2 (e.g., a resistor) and a resistance R3. The diode 1125 may be coupled to the current source 1140 and/or the negative voltage generator 1145 via a resistance R1 and a resistance R3. The resistance R1 is coupled in parallel to the resistance R2. The resistances R1 and R2 are coupled in series to the resistance R3. The resistance R3 is coupled in series to a capacitance C3 and the capacitance C3 is coupled to ground. The resistance R3 is also coupled to a switch 1130. The switch 1130 may be selectively coupled to the current source 1140 and the negative voltage generator 1145 (e.g., to provide a voltage or a negative voltage to the diodes 1120 and 1125). In one embodiment, the resistances R1, R2, and R3, the capacitance C3 and the switch 1130 may be part of the compensation circuit 1103. In other embodiments, one or more of the resistances R1, R2, and R3, the capacitance C3 and the switch 1130 may be separate from the compensation circuit 1103. For example, the switch 1130 and the capacitance C3 may not be part of the compensation circuit 1103.

In one embodiment, the node 1101 may receive a signal (e.g., an RF signal) having a power value and the node 1102 may output the signal when the FETs 1105 are in an ON state. The number of FETs in the switch circuit may be selected to allow the switch circuit 1100 to handle the power (e.g., power value) of the signal.

In one embodiment, the compensation circuit 1103 may compensate for a non-linearity effect generated by the FETs 1105 when the FETs 1105 are in an ON state (e.g., when the FETs 1105 receive an RF signal from the node 1101 and provide the RF signal to the node 1102). The compensation circuit 1103 may compensate for the non-linearity effect generated by the FETs 1105 independent of (e.g., regardless of) the frequency of the signal (e.g., RF signal) received by the FETs 1105 (via node 1101) and provided to the node 1102.

In one embodiment, the compensation circuit 1103 may compensate for the non-linearity effect (generated by the FETs 1105) by generating one or harmonics (e.g., a harmonic signal) that may be 180° out of phase with the IMD (e.g., IMD signal) and/or harmonics generated by the FETs 1105 when the FETs 1105 are in an ON state. For example, the compensation circuit 1103 may generate third-order harmonics (which may be referred to as H3) that may be 180° (or approximately 180°) out of phase with third-order IMD (which may be referred to as IMD3) generated by the FETs 1105 when the FETs 1105 are in an ON state. This may allow the one or more harmonics to cancel out the IMD (and/or harmonics) generated by the FETs 1105.

In one embodiment, the amplitude of the one or more harmonics generated by the compensation circuit 1103 may be adjusted by the adjusting the current used to bias the diodes 1120 and 1125. For example, the current provided by the current source 1140 may be changed/adjusted (e.g., to provide a higher current or a lower current) to change the amplitude of the one or more harmonics generated by the compensation circuit 1103. In one embodiment, the amplitude of the harmonics generated by the compensation circuit 1103 may be adjusted to match (or substantially match) the amplitude of the IMD (and/or harmonics) generated by the FETs 1105. For example, the amplitude of the third-order harmonics may be adjusted (by adjusting the current used to bias the diodes 1120 and 1125) to match the amplitude of the third-order IMD generated by the FETs 1105. This may allow the one or more harmonics to cancel out the IMD generated by the FETs 1105.

In one embodiment, the switches 1110 and 1115 may be in an ON state when the FETs 1105 are in an ON state. The switch 1130 may also couple the current source 1140 to the diodes 1120 and 1125, when the FETs 1105 are in the ON state. This may allow the diodes 1120 and 1125 (and/or the compensation circuit 1103) to compensate for the non-linearity effect generated by the FETs 1105 when the FETs 1105 are in the ON state (e.g., may allow the diodes 1120 and 1125, and/or the compensation circuit 1130 to generate harmonics to cancel out the IMD/harmonics generated by the FETs 1105). In another embodiment, the switches 1110 and 1115 may be in an OFF state when the FETs 1105 are in an OFF state. The switch 1130 may also couple the negative voltage generator 1145 to the diodes 1120 and 1125, when the FETs 1105 are in the OFF state. This may allow the diodes 1120 and 1125 (and/or the compensation circuit 1103) to generate little to no harmonics and/or IMD when the FETs 1105 are in the OFF state (e.g., when the switch circuit 1100 is OFF or in an OFF state).

In one embodiment the control module 1146 may control the operation of one or more of: the FETs 1105; the switch 1110; the switch 1115; and the switch 1130. For example, the control module 1146 may place the FETs 1105 in the ON state (e.g., may turn on the FETs 1105). The control module 1146 may also place the switches 1110 and 1115 in the ON state when the FETs 1105 are in the ON state. The control module 1146 may further couple the switch 1130 to the current source 1140 when the FETs 1105 are in the ON state. In another example, the control module 1146 may place the FETs 1105 in the OFF state (e.g., may turn off the FETs 1105). The control module 1146 may also place the switches 1110 and 1115 in the OFF state when the FETs 1105 are in the OFF state. The control module 1146 may further couple the switch 1130 to the negative voltage generator 1114 when the FETs 1105 are in the OFF state. The control module 1005 may be hardware (e.g., circuitry, dedicated logic, programmable logic, microcode, a processor, a field-programmable gate array (FPGA), an application-specific integrated circuit (ASIC), etc.), software (e.g., instructions run on a processor, firmware, or a combination thereof. The control module 1146 may be part of the RF circuit 1100 or may be separate from the RF circuit 1100 (e.g., the control module 1146 may reside in another component/circuit/module).

In some embodiments, the switch circuit 1100 may also include one or more bias/coupling circuits (as discussed in more detail in U.S. Pat. No. 9,160,328). For example, a coupling circuit (discussed in more detail in U.S. Pat. No. 9,160,328) may be coupled to one or more bodies of one or more of the FETs 1105.

Figure 10:
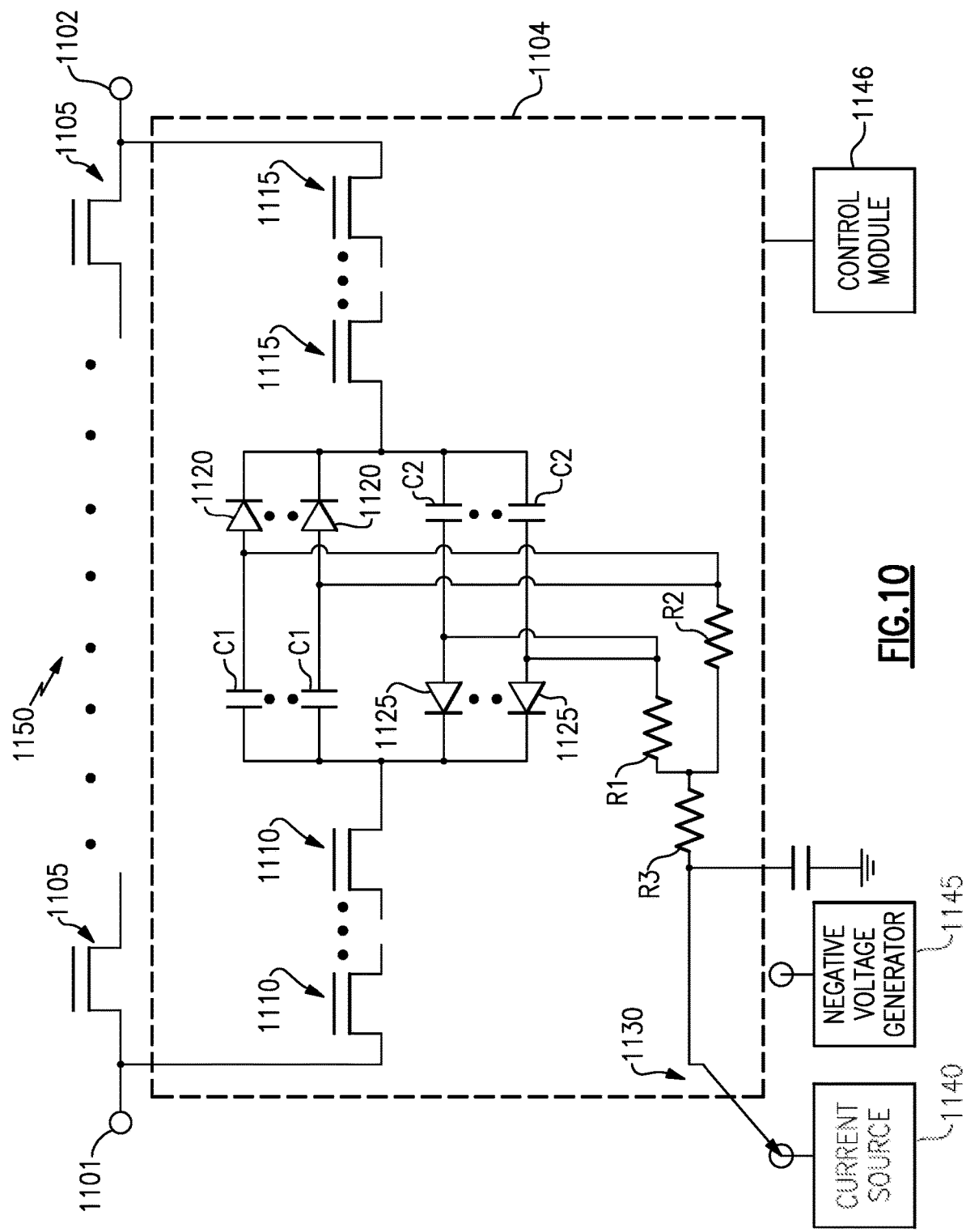
FIG. 10 shows an example of a switch circuit with a plurality of FETs coupled in parallel with a compensation circuit, in accordance with some embodiments.

FIG. 10 illustrates an example a switch circuit 1150, according to one embodiment. The switch circuit 1150 may have plurality of FETs 1105 (e.g., a set of FETs) configured to provide switching functionality between a first node 1101 and a second node 1102, as discussed above. In one embodiment, one or more of the FETs 1105 may be SOI FETs. Each FET 1105 may include a gate, a body, a source, and a drain. A gate (e.g., a gate terminal) of a FET 1105 may be biased by a bias voltage (e.g., $V_G$) provided by a gate bias circuit (not illustrated in FIG. 9) which may be coupled to the gate. A body (e.g., a body terminal) of the FET 120 may be biased by a bias voltage $V_B$ provided by a body bias circuit (not illustrated in FIG. 9) which may be coupled to the body. In one embodiment, the first node 1101 may be an input node and may receive a signal, such as an RF signal. The second node 1102 may be an output node and may output the signal (such as an RF signal). The plurality of FETs 1105 may output the signal (received at the from the first node 1101) via the second node 1102 when the plurality of FETs 1105 are in an ON state. The plurality of FETs 1105 may prevent (may stop) a signal (received at the first node 1101) from being outputted via the second node 1102 when the plurality of FETs 1105 are in an OFF state.

As illustrated in FIG. 10, the plurality of FETs 1105 are coupled in parallel with a with a compensation circuit 1104. The compensation circuit includes a set of diodes 1120 coupled antiparallel to a set of diodes 1125. The set of diodes 1120 and the set of diodes 1125 may be referred to as antiparallel diodes and/or may be referred to as diodes that are coupled in an antiparallel configuration. The anodes of the set of diodes 1120 are coupled in series to a capacitance C1 (e.g., a capacitor) and the capacitance C1 is coupled to a switches 1110 in series. The switch 1110 is also coupled (at a first end of the compensation circuit 1104) to a node/junction that is between the node 1101 and the first FET 1105. The cathodes of the set of diodes 1120 are coupled in series to a switch 1115. The anodes of the set of diodes 1125 are coupled to a capacitance C2 in series and the capacitance C2 is coupled to the switch 1115 in series. The switch 1115 is also coupled (at a second end of the compensation circuit 1104) to a node/junction that is between the node 1102 and the last FET 1105. The cathodes of the set of diodes 1125 are coupled to the switch 1110 in series.

The diodes 1120 and 1125 may be biased by a current (or a voltage) received from the current source 1140 and/or may be biased by a negative voltage received from the negative voltage generator 1145. The diodes 1120 may be coupled to the current source 1140 and/or the negative voltage generator 1145 via a resistance R2 (e.g., a resistor) and a resistance R3. The diodes 1125 may be coupled to the current source 1140 and/or the negative voltage generator 1145 via a resistance R1 and a resistance R3. The resistance R1 is coupled in parallel to the resistance R2. The resistances R1 and R2 are coupled in series to the resistance R3. The resistance R3 is coupled in series to a capacitance C3 and the capacitance C3 is coupled to ground. The resistance R3 is also coupled to a switch 1130. The switch 1130 may be selectively coupled to the current source 1140 and the negative voltage generator 1145 (e.g., to provide a voltage or a negative voltage to the diodes 1120 and 1125). In one embodiment, the resistances R1, R2, and R3, the capacitance C3 and the switch 1130 may be part of the compensation circuit 1104, as discussed above. In other embodiments, one or more of the resistances R1, R2, and R3, the capacitance C3 and the switch 1130 may be separate from the compensation circuit 1104, as discussed above.

In one embodiment, the node 1101 may receive a signal (e.g., an RF signal) having a power value and the node 1102 may output the signal when the FETs 1105 are in an ON state. The number of FETs in the switch circuit 1150 may be selected to allow the switch circuit 1150 to handle the power (e.g., power value) of the signal.

In one embodiment, the compensation circuit 1104 may compensate for a non-linearity effect generated by the FETs 1105 when the FETs 1105 are in an ON state (e.g., when the FETs 1105 receive an RF signal from the node 1101 and provide the RF signal to the node 1102). The compensation circuit 1104 may compensate for the non-linearity effect generated by the FETs 1105 independent of (e.g., regardless of) the frequency of the signal (e.g., RF signal) received by the FETs 1105 (via node 1101) and provided to the node 1102.

In one embodiment, the compensation circuit 1104 may compensate for the non-linearity effect (generated by the FETs 1105) by generating one or harmonics (e.g., a harmonic signal) that may be 180° out of phase with the IMD (e.g., IMD signal) and/or harmonics generated by the FETs 1105 when the FETs 1105 are in an ON state, as discussed above. In another embodiment, the amplitude of the one or more harmonics generated by the compensation circuit 1104 may be adjusted by the adjusting the current used to bias the diodes 1120 and 1125, as discussed above. In one embodiment, the amplitude of the harmonics generated by the compensation circuit 1104 may be adjusted to match (or substantially match) the amplitude of the IMD (and/or harmonics) generated by the FETs 1105 as discussed above.

In one embodiment, the switches 1110 and 1115 may be in an ON state when the FETs 1105 are in an ON state. The switch 1130 may also couple the current source 1140 to the diodes 1120 and 1125, when the FETs 1105 are in the ON state. This may allow the diodes 1120 and 1125 (and/or the compensation circuit 1104) to compensate for the non-linearity effect generated by the FETs 1105 when the FETs 1105 are in the ON state (e.g., may allow the diodes 1120 and 1125, and/or the compensation circuit 1130 to generate harmonics to cancel out the IMD (and/or harmonics) generated by the FETs 1105). In another embodiment, the switches 1110 and 1115 may be in an OFF state when the FETs 1105 are in an OFF state. The switch 1130 may also couple the negative voltage generator 1145 to the diodes 1120 and 1125, when the FETs 1105 are in the OFF state. This may allow the diodes 1120 and 1125 (and/or the compensation circuit 1104) to generate little to no harmonics and/or IMD when the FETs 1105 are in the OFF state (e.g., when the switch circuit 1150 is OFF or in an OFF state).

In one embodiment the control module 1146 may control the operation of one or more of: the FETs 1105; the switch 1110; the switch 1115; and the switch 1130, as discussed above. The control module 1005 may be hardware (e.g., circuitry, dedicated logic, programmable logic, microcode, a processor, a field-programmable gate array (FPGA), an application-specific integrated circuit (ASIC), etc.), software (e.g., instructions run on a processor, firmware, or a combination thereof. The control module 1146 may be part of the RF circuit 1100 or may be separate from the RF circuit 1140 (e.g., the control module 1146 may reside in another component/circuit/module).

In some embodiments, the switch circuit 1150 may also include one or more bias/coupling circuits (as discussed in more detail in U.S. Pat. No. 9,160,328). For example, a coupling circuit (discussed in more detail in U.S. Pat. No. 9,160,328) may be coupled to one or more bodies of one or more of the FETs 1105.

One having ordinary skill in the art understands that the various values for the capacitances and/or resistances may be used in the compensation circuit 1103 (illustrated in FIG. 9) and/or the compensation circuit 1104 (illustrated in FIG. 10). For example, the capacitances C1 and C2 may be 5 picofarads, and the capacitance C3 may be 2 picofarads. In another example, the resistances R1 and R2 may be 10000 (10K) ohms and the resistance R3 may be 40000 (40K) ohms.

In some implementations, the foregoing example configurations described in reference to FIGS. 9 and 10 (and generally described herein) may allow significant or substantially complete cancellation of non-linearity effects associated with one or more SOI FET based RF switches. In some embodiments, such configurations can be implemented so that minimal or relatively little additional area is required.

Examples of Implementations in Products:

Various examples of FET-based switch circuits and bias/coupling configurations described herein can be implemented in a number of different ways and at different product levels. Some of such product implementations are described by way of examples.

Semiconductor Die Implementation

Figure 11A:
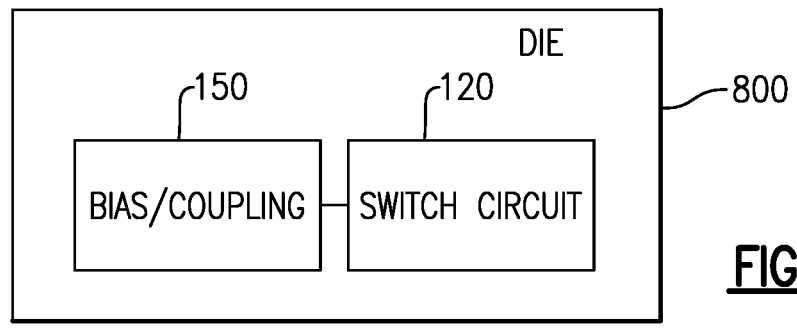
FIG. 11A shows an example switch circuit and an example bias/coupling circuit implemented on a die, in accordance with some embodiments.
Figure 11B:
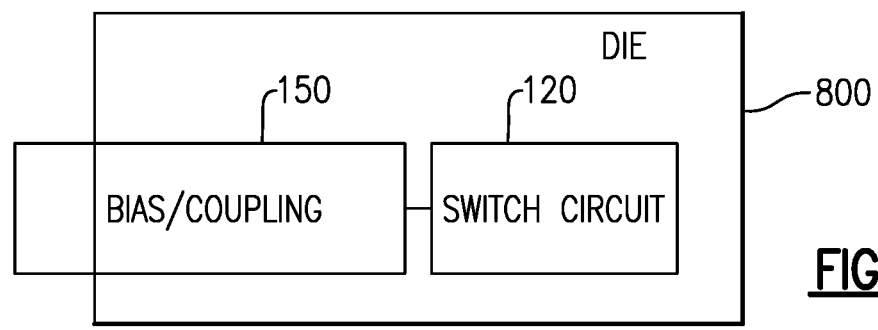
FIG. 11B shows at least some of an example bias/coupling circuit implemented outside of a die, in accordance with some embodiments.

FIGS. 11A-11D schematically show non-limiting examples of such implementations on one or more semiconductor die. FIG. 11A shows that in some embodiments, a switch circuit 120 and a bias/coupling circuit 150 having one or more features as described herein can be implemented on a die 800. In addition, a compensation circuit (e.g., compensation circuit 1103 illustrated in FIG. 9 or compensation circuit 1104 illustrated in FIG. 10) may also be implemented on the die 800. FIG. 11B shows that in some embodiments, at least some of the bias/coupling circuit 150 can be implemented outside of the die 800 of FIG. 11A. In addition, at least some or part of a compensation circuit (e.g., compensation circuit 1103 illustrated in FIG. 9 or compensation circuit 1104 illustrated in FIG. 10) may also be implemented outside of the die 800.

Figure 11C:
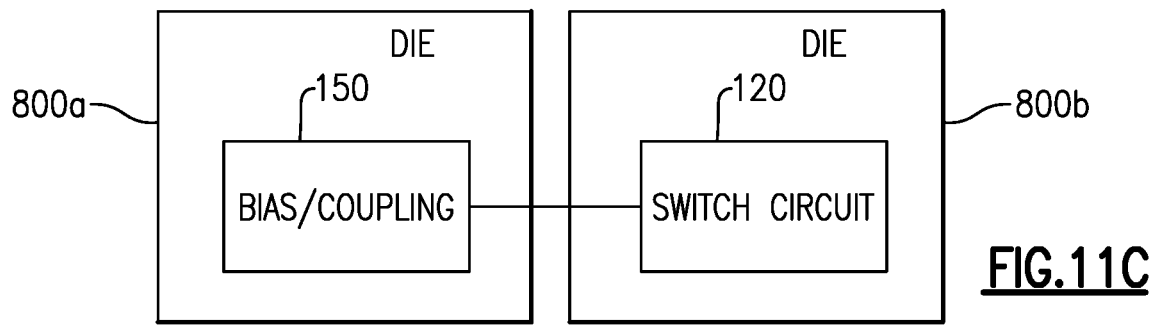
FIG. 11C shows an example switch circuit and an example bias/coupling circuit implemented on distinct die, in accordance with some embodiments.
Figure 11D:
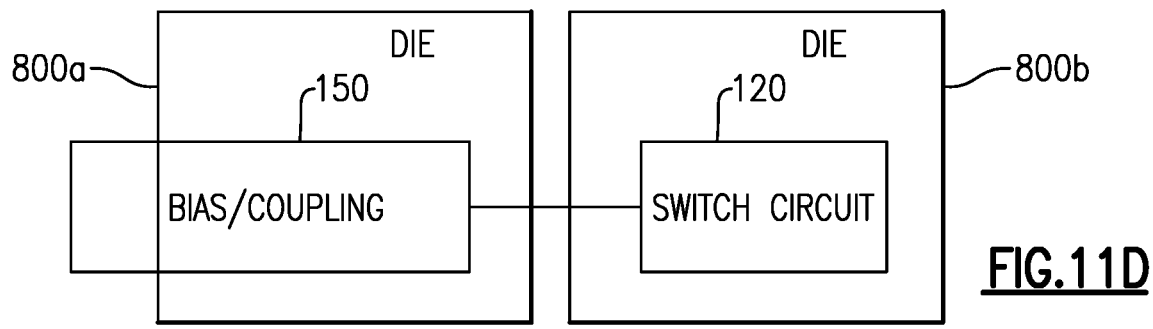
FIG. 11D shows at least some of an example bias/coupling circuit implemented outside of a die, in accordance with some embodiments.

FIG. 11C shows that in some embodiments, a switch circuit 120 having one or more features as described herein can be implemented on a second die 800b, and a bias/coupling circuit 150 having one or more features as described herein can be implemented on a first die 800a. In addition, a compensation circuit (e.g., compensation circuit 1103 illustrated in FIG. 9 or compensation circuit 1104 illustrated in FIG. 10) may also be implemented on the first die 800a. FIG. 11D shows that in some embodiments, at least some of the bias/coupling circuit 150 can be implemented outside of the first die 800a of FIG. 11C. In addition, at least some or part of a compensation circuit (e.g., compensation circuit 1103 illustrated in FIG. 9 or compensation circuit 1104 illustrated in FIG. 10) may also be implemented outside of the first die 800a.

Packaged Module Implementation

Figure 12A:
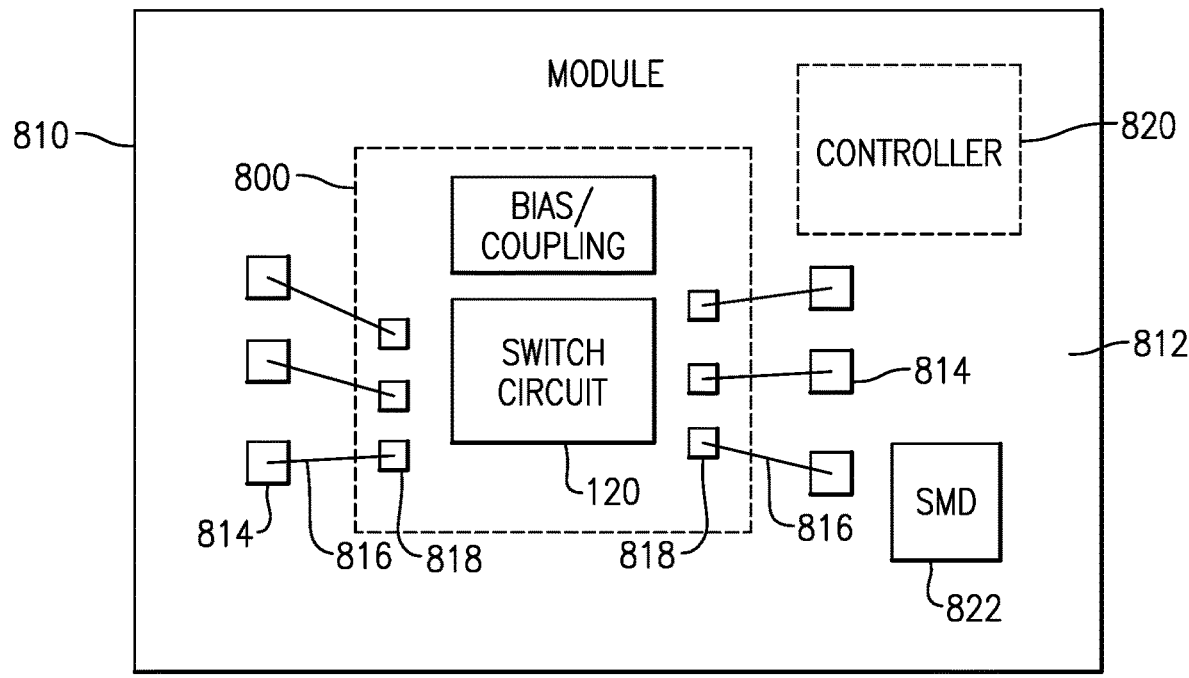
FIG. 12A shows a plan view of an example packaged module, in accordance with some embodiments.

In some embodiments, one or more die having one or more features described herein can be implemented in a packaged module. An example of such a module is shown in FIGS. 12A (plan view) and 12B (side view). Although described in the context of both of the switch circuit and the bias/coupling circuit being on the same die (e.g., example configuration of FIG. 11A), it will be understood that packaged modules can be based on other configurations.

A module 810 is shown to include a packaging substrate 812. Such a packaging substrate can be configured to receive a plurality of components, and can include, for example, a laminate substrate. The components mounted on the packaging substrate 812 can include one or more dies. In the example shown, a die 800 having a switching circuit 120 and a bias/coupling circuit 150 is shown to be mounted on the packaging substrate 812. The die 800 can be electrically connected to other parts of the module (and with each other where more than one die is utilized) through connections such as connection-wirebonds 816. Such connection-wirebonds can be formed between contact pads 818 formed on the die 800 and contact pads 814 formed on the packaging substrate 812. In some embodiments, one or more surface mounted devices (SMDs) 822 can be mounted on the packaging substrate 812 to facilitate various functionalities of the module 810.

In some embodiments, the packaging substrate 812 can include electrical connection paths for interconnecting the various components with each other and/or with contact pads for external connections. For example, a connection path 832 is depicted as interconnecting the example SMD 822 and the die 800. In another example, a connection path 832 is depicted as interconnecting the SMD 822 with an external-connection contact pad 834. In yet another example a connection path 832 is depicted as interconnecting the die 800 with ground-connection contact pads 836.

In some embodiments, a space above the packaging substrate 812 and the various components mounted thereon can be filled with an overmold structure 830. Such an overmold structure can provide a number of desirable functionalities, including protection for the components and wirebonds from external elements, and easier handling of the packaged module 810.

Figure 12B:
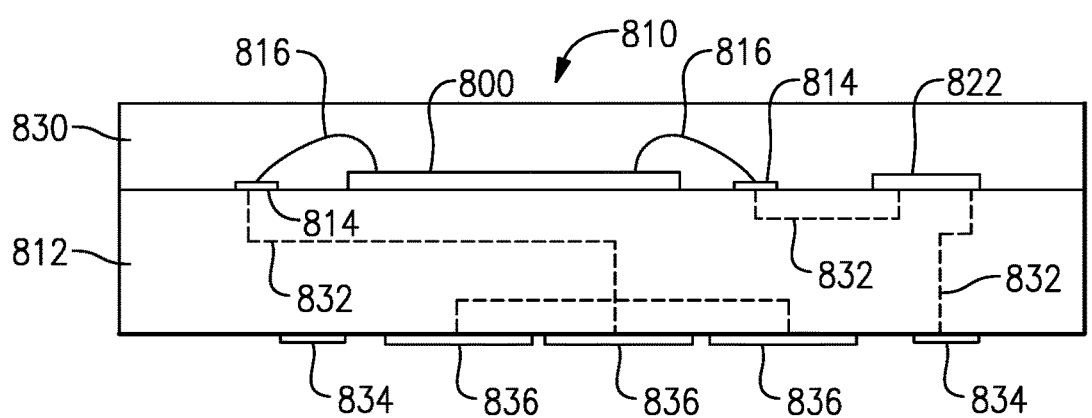
FIG. 12B shows a side sectional view of an example packaged module, in accordance with some embodiments.
Figure 13:
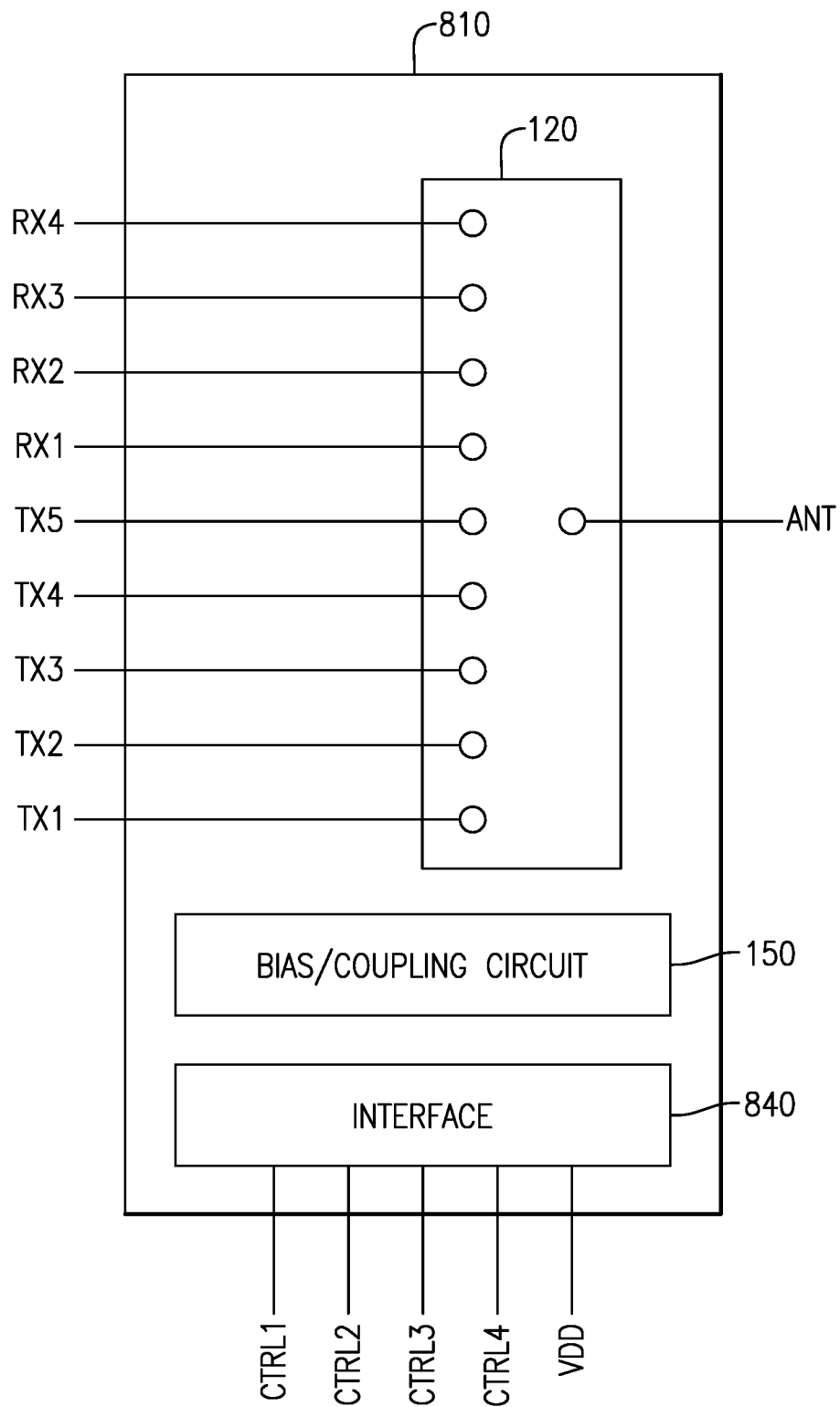
FIG. 13 shows a schematic diagram of an example switching configuration, in accordance with some embodiments.

FIG. 13 shows a schematic diagram of an example switching configuration that can be implemented in the module 810 described in reference to FIGS. 12A and 12B. In the example, the switch circuit 120 is depicted as being an SP9T switch, with the pole being connectable to an antenna and the throws being connectable to various Rx and Tx paths. Such a configuration can facilitate, for example, multi-mode multi-band operations in wireless devices.

The module 810 can further include an interface for receiving power (e.g., supply voltage VDD) and control signals to facilitate operation of the switch circuit 120 and/or the bias/coupling circuit 150. In some implementations, supply voltage and control signals can be applied to the switch circuit 120 via the bias/coupling circuit 150.

Figure 14:
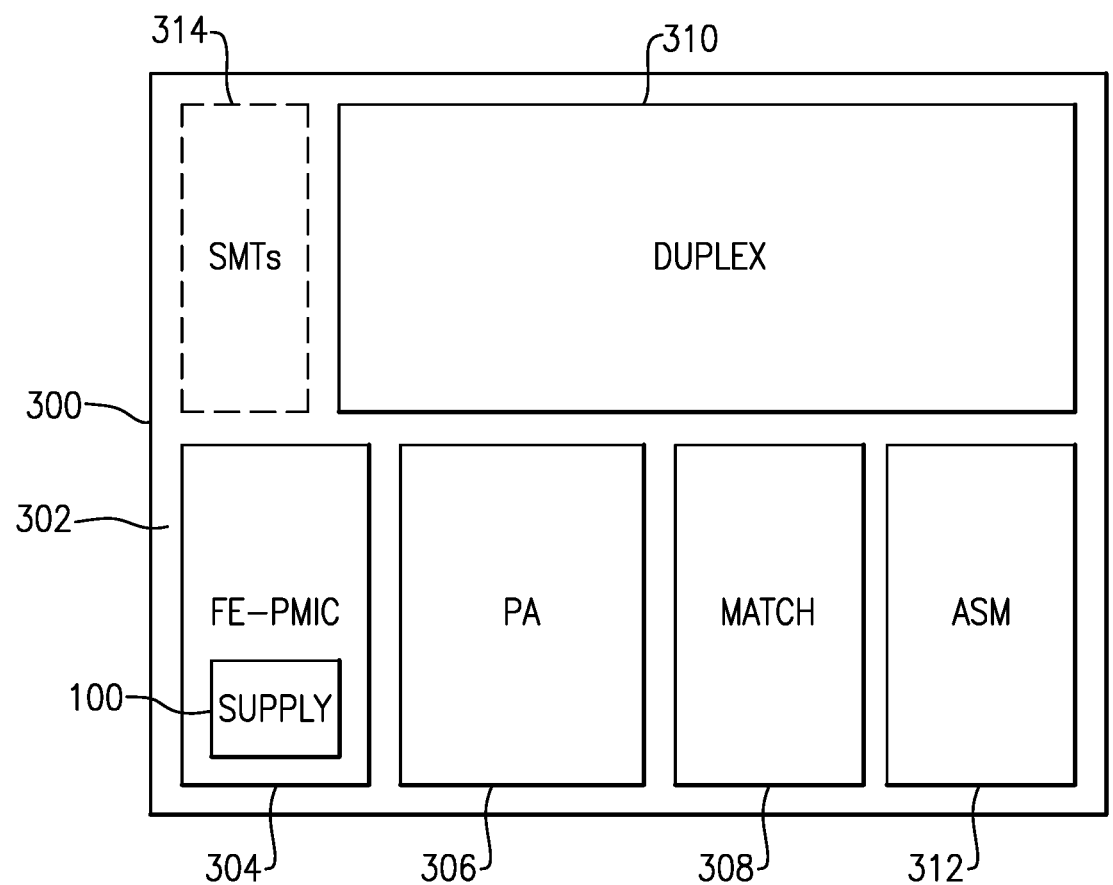
FIG. 14 shows an example module, in accordance with some embodiments.

FIG. 14 shows that in some embodiments, some or all of the devices and/or serial buses/interfaces having one or more features as described herein may be implemented in a module. Such a module may be, for example, a front-end module (FEM). In the example of FIG. 14, a radio frequency (RF) module 300 can include a packaging substrate 302, and a number of components may be mounted on such a packaging substrate. For example, a front-end power management integrated circuit (FE-PMIC) component 304, a power amplifier assembly 306, a match component 308, and a duplexer assembly 310 may be mounted and/or implemented on and/or within the packaging substrate 302. The FE-PMIC component 304 includes a supply 100 which may be a power supply (e.g., a battery, a voltage/power source) and/or may be coupled to a power supply. Other components such as a number of surface mount technology (SMT) devices 314 and an antenna switch module (ASM) 312 can also be mounted on the packaging substrate 302. Although all of the various components are depicted as being laid out on the packaging substrate 302, it will be understood that some component(s) may be implemented over other component(s). In some embodiments, the components of the RF module 300 and one or more serial buses/interfaces (e.g., a RFFE bus/interface) used by the components of the RF module 300 may implement and/or perform one or more features as described herein.

In some implementations, a device and/or a circuit having one or more features described herein may be included in a device such as a wireless device. Such a device and/or a circuit may be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

Wireless Device Implementation

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

Figure 15:
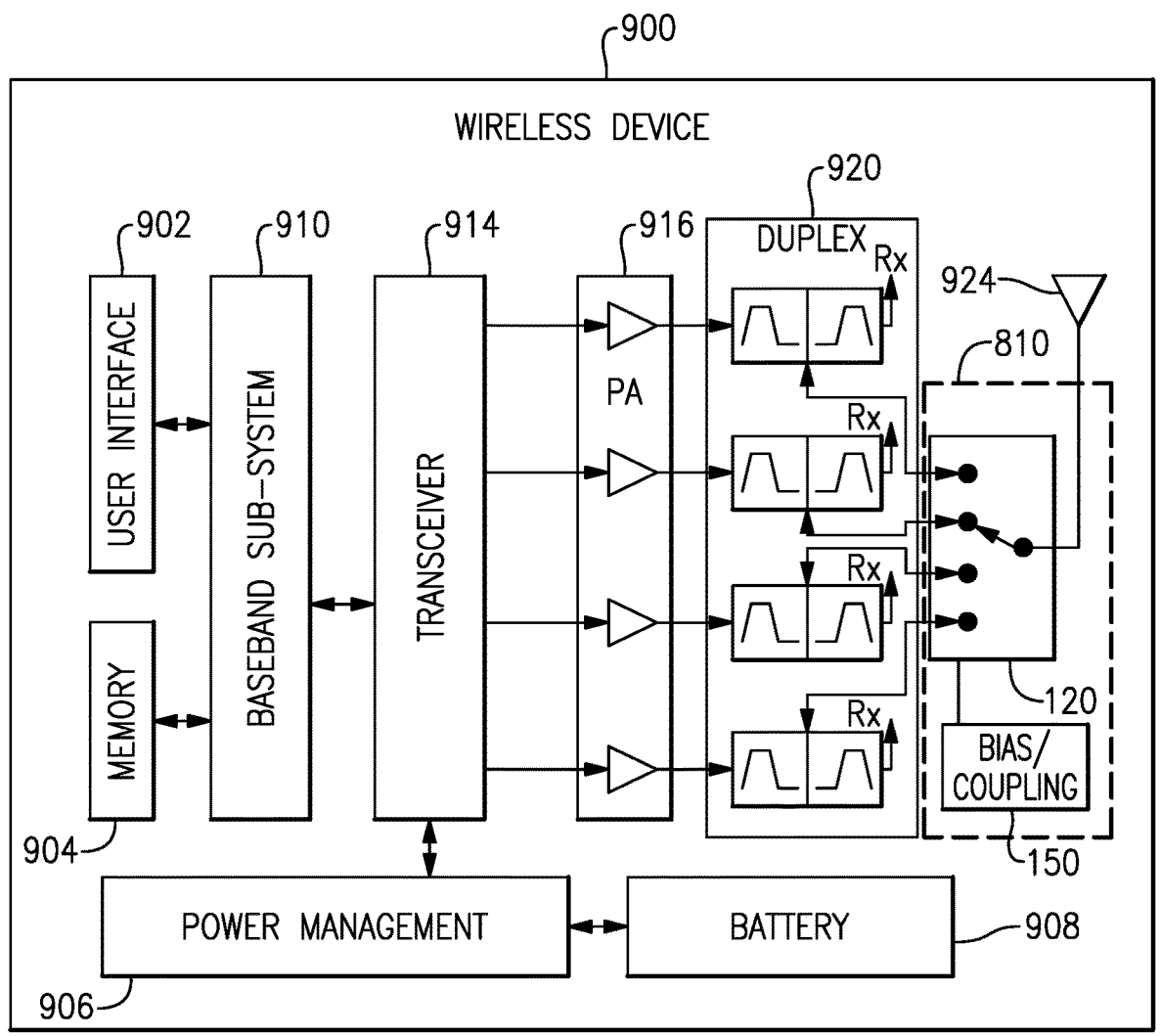
FIG. 15 shows a schematic representation of an example wireless device, in accordance with some embodiments.

FIG. 15 schematically depicts an example wireless device 900 having one or more advantageous features described herein. In the context of various switches and various biasing/coupling configurations as described herein, a switch 120 and a bias/coupling circuit 150 can be part of a module 810. In some embodiments, such a switch module can facilitate, for example, multi-band multi-mode operation of the wireless device 900.

In the example wireless device 900, a power amplifier (PA) module 916 having a plurality of PAs can provide an amplified RF signal to the switch 120 (via a duplexer 920), and the switch 120 can route the amplified RF signal to an antenna. The PA module 916 can receive an unamplified RF signal from a transceiver 914 that can be configured and operated in known manners. The transceiver can also be configured to process received signals. The transceiver 914 is shown to interact with a baseband sub-system 910 that is configured to provide conversion between data and/or voice signals suitable for a user and RF signals suitable for the transceiver 914. The transceiver 914 is also shown to be connected to a power management component 906 that is configured to manage power for the operation of the wireless device 900. Such a power management component can also control operations of the baseband sub-system 910 and the module 810.

The baseband sub-system 910 is shown to be connected to a user interface 902 to facilitate various input and output of voice and/or data provided to and received from the user. The baseband sub-system 910 can also be connected to a memory 904 that is configured to store data and/or instructions to facilitate the operation of the wireless device, and/or to provide storage of information for the user.

In some embodiments, the duplexer 920 can allow transmit and receive operations to be performed simultaneously using a common antenna (e.g., 924). In FIG. 14, received signals are shown to be routed to "Rx" paths (not shown) that can include, for example, a low-noise amplifier (LNA).

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

Additional Embodiments

Figure 16:
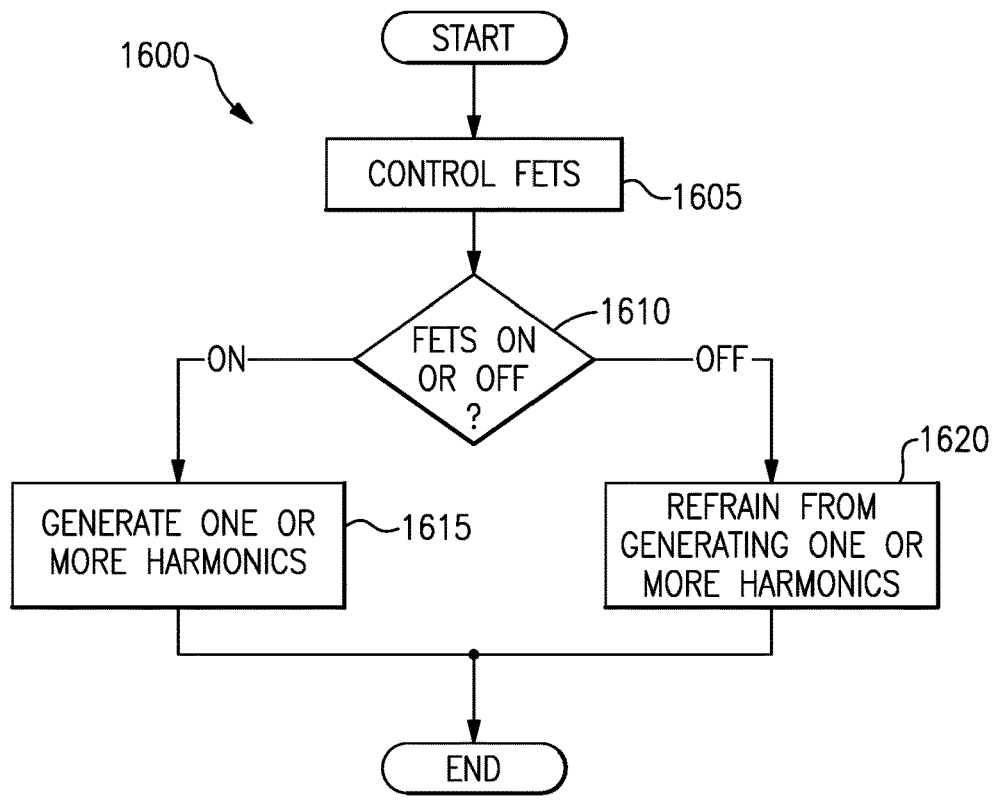
FIG. 16 shows a flow diagram of a process for opening a switch, in accordance with some embodiments.

FIG. 16 is a flow diagram illustrating process 1600 for operating a switch (e.g., a FET or a switch circuit, such as switch circuit 1100 illustrated in FIG. 9 or switch circuit 1150 illustrated in FIG. 10), according to some embodiments of the present disclosure. The process 1600 may be performed by processing logic that comprises hardware (e.g., circuitry, dedicated logic, programmable logic, microcode, a processor, a FPGA, an ASIC, etc.), software (e.g., instructions run on a processor), firmware, or a combination thereof. In one embodiment, process 1600 may be performed by a control module (as illustrated in FIGS. 9 and 10). In addition, the process 1600 could alternatively be represented as a series of interrelated states via a state diagram or events. In some embodiments, the process 1600 may be at least partially performed by a processor executing code stored in a non-transitory computer-readable medium (e.g., a memory).

The process begins at block 1605 where the process 1600 controls a set of FETs so that the set of FETs are in an ON state or an OFF state. For example, the process 1600 may turn the set of FETs ON or may turn the set of FETs OFF. At block 1610, the process 1600 determines whether the FETs are ON or OFF.

If the FETs are ON, the process 1600 may generate one or more harmonics to compensate for a non-linearity effect generated by the set of FETs. For example, the process 1600 may couple antiparallel diodes (e.g., diodes 1120 and 1125 illustrated in FIGS. 9 and 10) to a current source by turning one or more switches ON (e.g., switches 1110 and 1115 illustrated in FIGS. 9 and 10) and/or by connecting a switch (e.g., switch 1130 illustrated in FIGS. 9 and 10) to a current source (as discussed above). Coupling the antiparallel diodes to the current source may bias the antiparallel diodes with a current which may generate the one or more harmonics, as discussed above.

If the FETs are OFF, the process 1600 may refrain from generating the one or more harmonics. For example, the process 1600 may couple antiparallel diodes (e.g., diodes 1120 and 1125 illustrated in FIGS. 9 and 10) to a negative voltage generator by connecting a switch (e.g., switch 1130 illustrated in FIGS. 9 and 10) to the negative voltage generator (as discussed above). The process 1600 may also turn one or more switches OFF (e.g., switches 1110 and 1115 illustrated in FIGS. 9 and 10) to decouple and/or substantially isolate the antiparallel diodes from the set of FETs. This may allow the antiparallel diodes to generate little to no harmonics and/or IMD when the set of FETs are in the OFF state, as discussed above.

Figure 17:
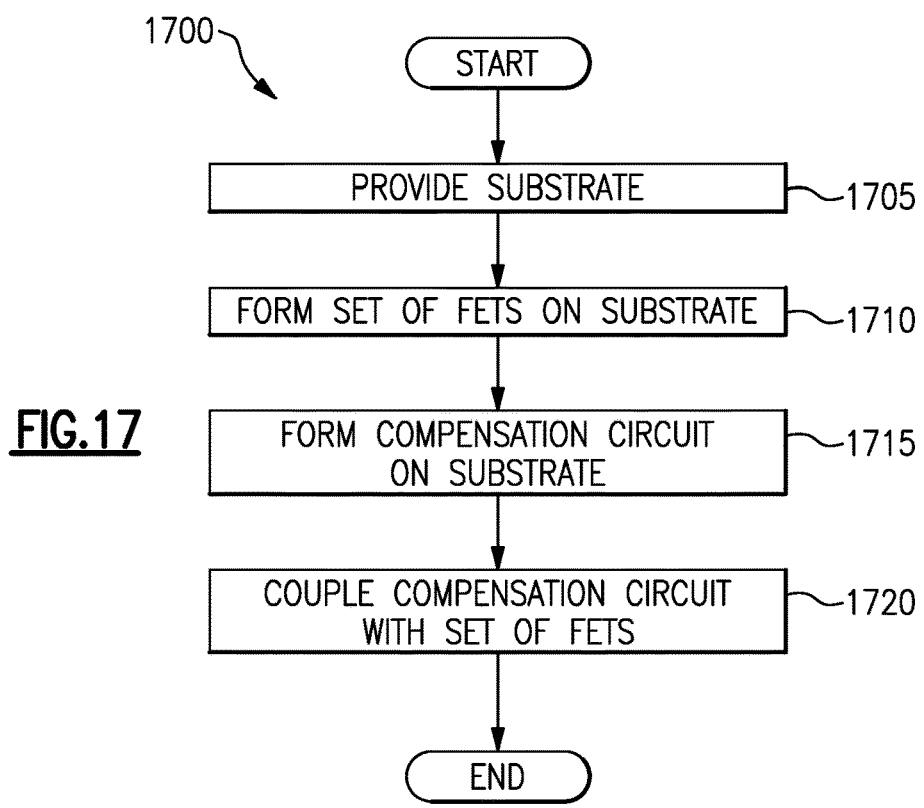
FIG. 17 shows a flow diagram of a process for fabricating a switch, in accordance with some embodiments.

FIG. 17 for fabricating a switch (e.g., a FET or a switch circuit, such as switch circuit 1100 illustrated in FIG. 9 or switch circuit 1150 illustrated in FIG. 10) having one or more features as described herein, according to some embodiments of the present disclosure. The process 1700 may be performed by processing logic that comprises hardware (e.g., circuitry, dedicated logic, programmable logic, microcode, a processor, a FPGA, an ASIC, etc.), software (e.g., instructions run on a processor), firmware, or a combination thereof. In addition, the process 1700 could alternatively be represented as a series of interrelated states via a state diagram or events. In some embodiments, the process 1700 may be at least partially performed by a processor executing code stored in a non-transitory computer-readable medium (e.g., a memory).

The process 1700 begins at block 1705 where the process 1700 provides a substrate. For example, a semiconductor substrate and/or a packaging substrate may be provided. At block 1710, the process 1700 may form a set of FETs on the substrate. Each FET may have a respective source, drain, gate, and body. At block 1715, the process 1700 may form a compensation circuit on the substrate. The compensation circuit is described in more detail above in conjunction with FIGS. 9 and 10. The process 1700 may couple the compensation circuit to the set of FETs at block 1720. The set of FETs and the compensation circuit may be coupled in parallel, as discussed above.

Figure 18:
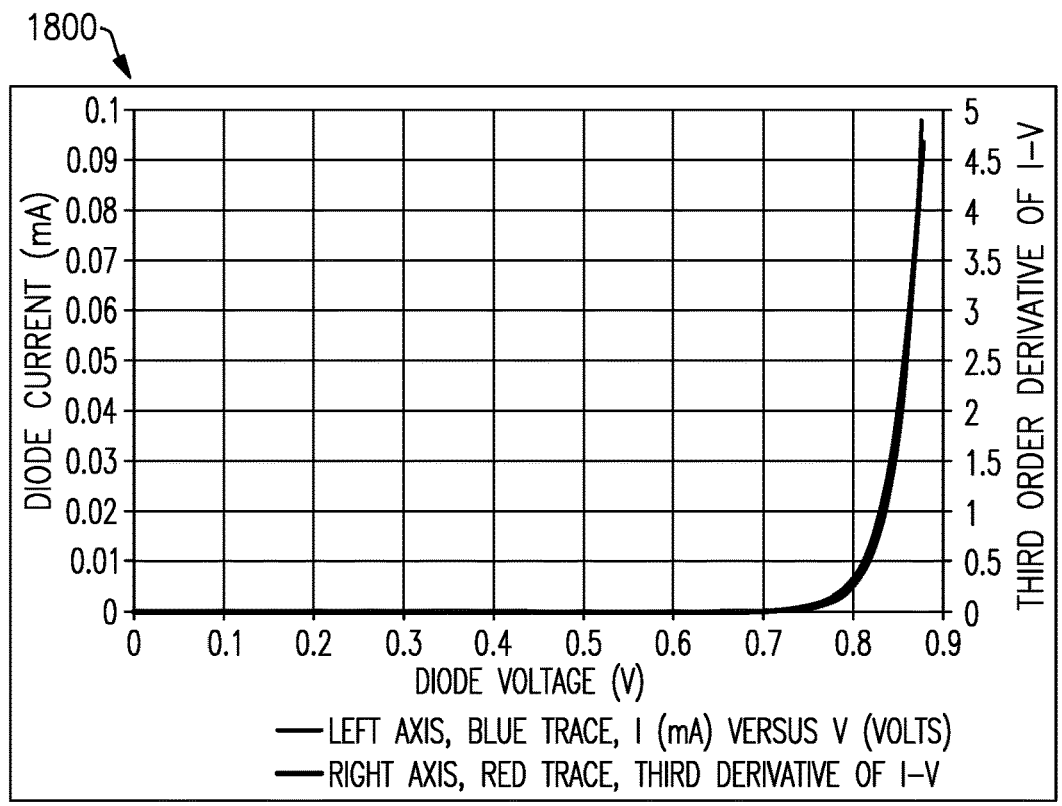
FIG. 18 shows an example graph illustrating third-order harmonics versus bias current and/or voltage of one or more diodes, in accordance with some embodiments.

FIG. 18 is an example graph 1800 illustrating example third-order harmonics (H3) generated by a set of diodes (e.g., antiparallel diodes), versus the current and/or voltage used to bias the set of diodes. The left side of the graph indicates the amount of current that is used to bias the set of diodes (e.g., that is applied to the set of diodes). The right side of the graph indicates the third-order derivative of one or more diodes for a given current-voltage (e.g., I-V). The bottom of the graph indicates the amount of voltage that is used to bias the set of diodes.

$$y = a_1 \cdot x + a_2 \cdot x^2 + a_3 \cdot x^3 + a_4 \cdot x^4 + \ldots \quad (1)$$

$$y = b_1 \cdot x + b_2 \cdot x^2 + b_3 \cdot x^3 + b_4 \cdot x^4 + \ldots \quad (2)$$

In one embodiment, equation (1) may be a power series equation that approximates the input (voltage) and output (current) relationship for a set of FETs. In another embodiment, equation (2) may be a power series equation that approximates the input (voltage) and output (current) relationship for a set of diodes (e.g., antiparallel diodes illustrated above in FIGS. 9 and 10). The coefficient "a3" may determine the phase and/or the amplified of the third-order IMD (or third-order harmonic) of the set of FETs and the coefficient "b3" may determine the phase and/or the amplified of the third-order IMD (or third-order harmonic) of the set of diodes. The coefficient "b3" may be the negative value of the value of coefficient "a3." This may indicate that the set of diodes may generate one or more harmonics that may cancel the harmonics/IMD generated by the set of FETs. In one embodiment, the equations (1) and (2) do not include variables and/or coefficients for inductances and/or capacitance. Thus, the ability of the set of diodes to compensate and/or cancel the harmonics/IMD of the set of FETs may be independent of the frequency of a signal received by the set of FETs.

Figure 19:
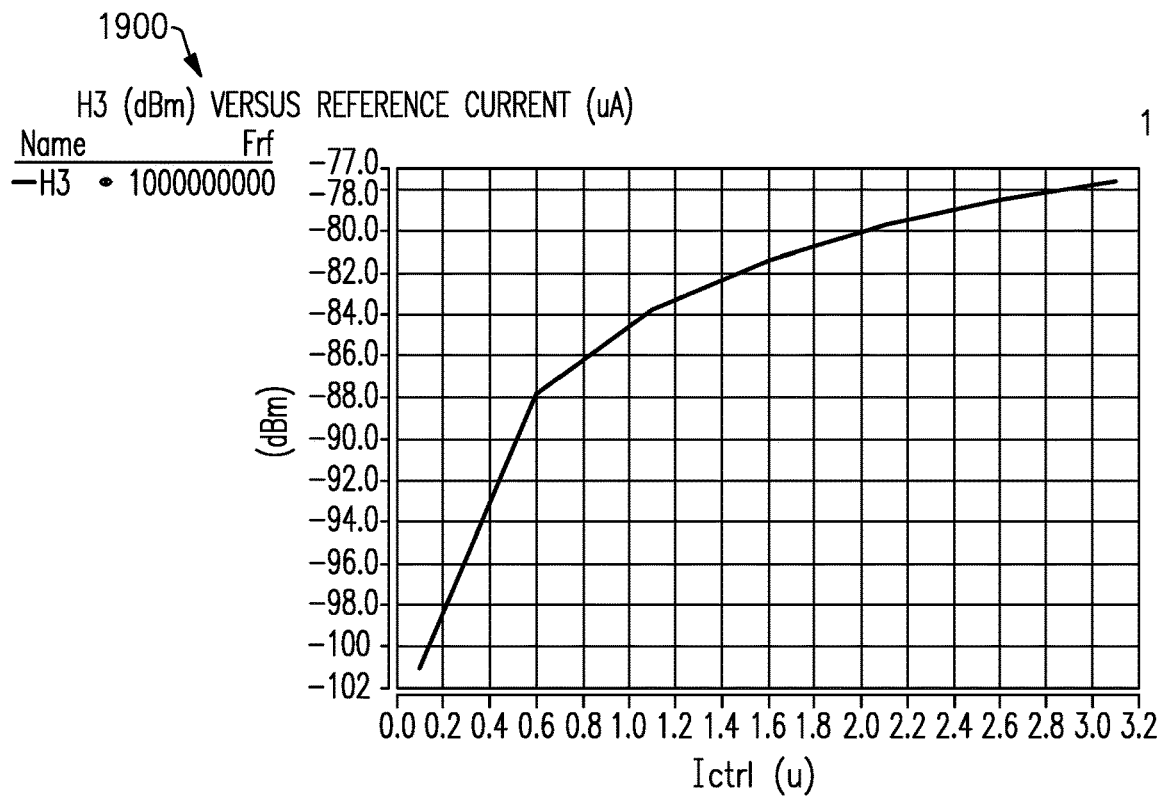
FIG. 19 shows an example graph illustrating third-order harmonics versus a reference current and/or voltage of one or more diodes, in accordance with some embodiments.

FIG. 19 is an example graph 1900 illustrating example third-order harmonics (H3) generated by a set of diodes, versus a reference current and/or voltage that is used to bias the set of diodes. As illustrated in FIG. 19, the value of H3 increases as the reference current increases.

Figure 20:
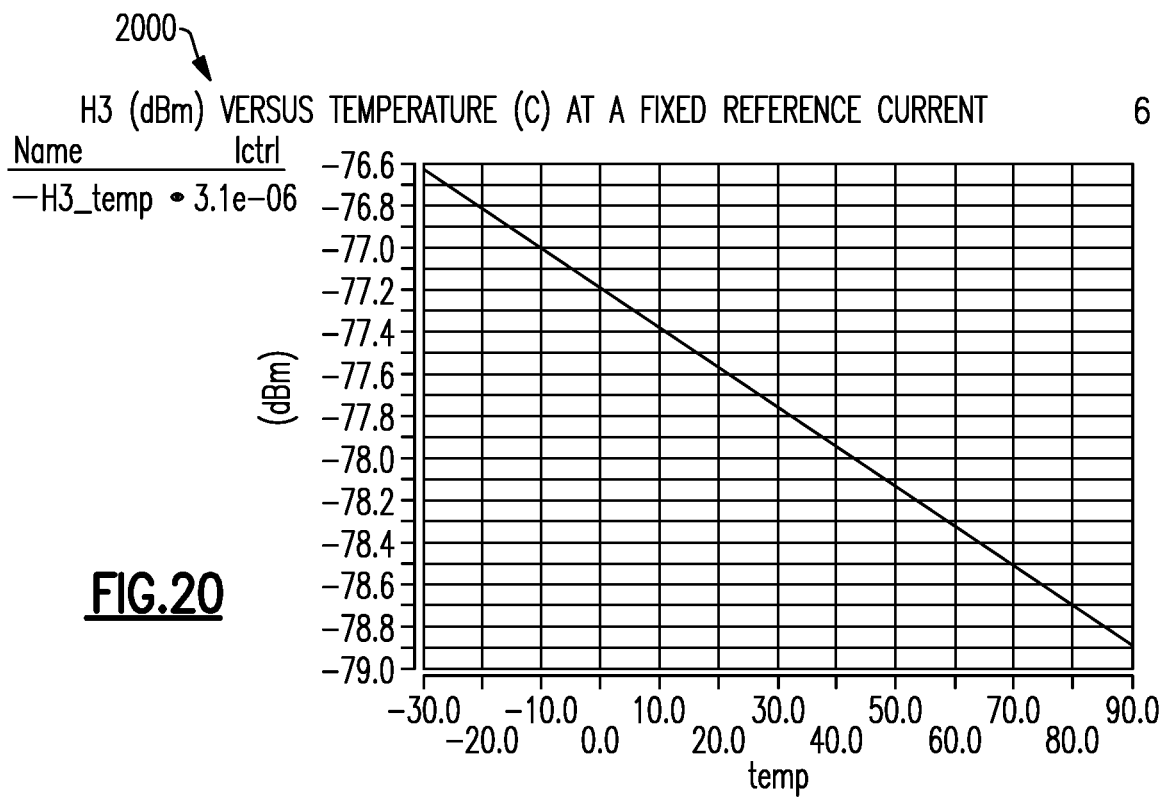
FIG. 20 shows an example graph illustrating third-order harmonics versus temperature of one or more diodes, in accordance with some embodiments.

FIG. 20 is an example graph 2000 illustrating example third-order harmonics (H3) generated by a set of diodes (e.g., antiparallel diodes) biased by a fixed reference current, versus temperatures of the set of diodes. As illustrated in the graph 2000, the value of H3 varies by approximately 2.4 dBm (e.g., varies between approximately −79.0 dBm and approximately −76.6 dBm) when the temperature of the set of diodes varies between −30° Celsius and 90° Celsius.

Figure 21:
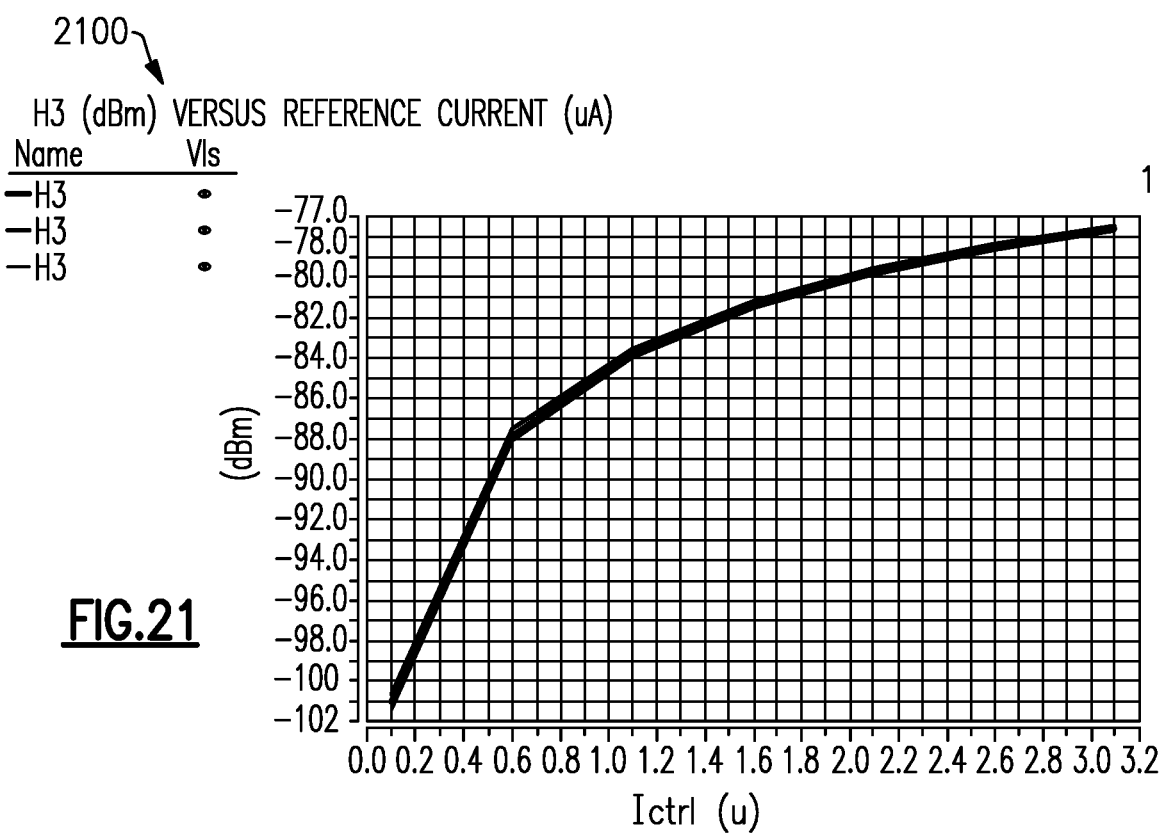
FIG. 21 shows an example graph illustrating third-order harmonics versus reference current of one or more diodes, in accordance with some embodiments.

FIG. 21 is an example graph 2100 illustrating example third-order harmonics (H3) generated by a set of diodes versus a reference current and/or voltage that is used to bias the set of diodes, for different manufacturing processes. As discussed above, a set of diodes (e.g., antiparallel diodes) may be used to compensate for a non-linearity effect caused by a set of FETs. The set of diodes and/or the set of FETs may be fabricated, implemented, formed, and/or manufactured using various processes (e.g., using various manufacturing and/or fabrication processes). Graph 2100 illustrates that the third-order harmonics (H3) generated by a set of diodes may be substantially similar over a range of currents, regardless which process may be used to fabricate/manufacture the set of diodes and/or the set of FETs.

Figure 22:
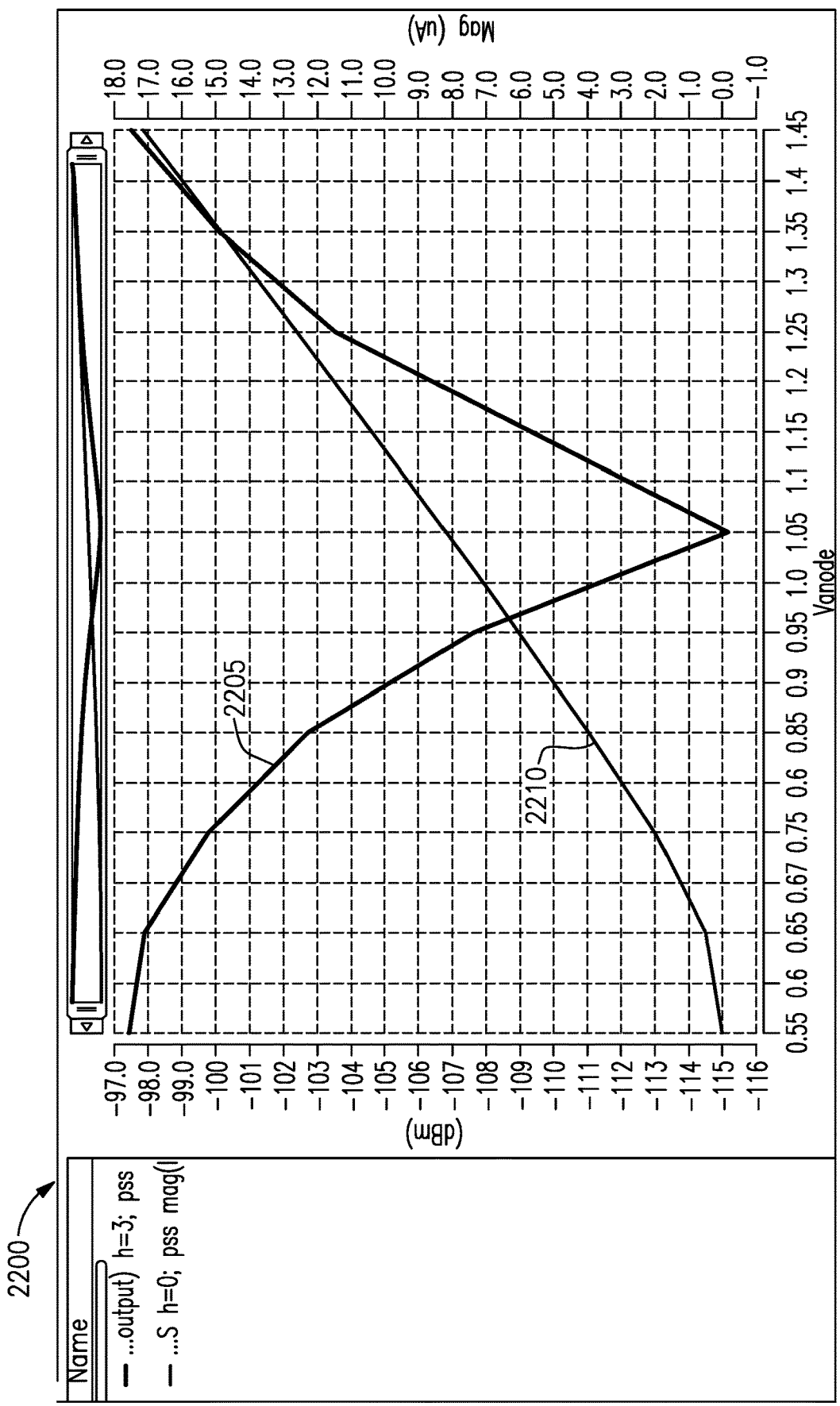
FIG. 22 shows an example graph illustrating third-order harmonics versus bias current and/or voltage of one or more diodes, in accordance with some embodiments.

FIG. 22 is an example graph 2100 illustrating example third-order harmonics (H3) generated by a set of diodes (e.g., antiparallel diodes), versus the current and/or voltage used to bias the set of diodes. The right side of the graph indicates the amount of current that is used to bias the set of diodes (e.g., that is applied to the set of diodes). The left side of the graph indicates the third-order harmonics (H3) generated by the set of diodes. The bottom of the graph indicates the amount of voltage that is used to bias the set of diodes. The line 2205 illustrates the third-order harmonics generated by the set of diodes as a function of voltage and as a function of current. The line 2210 illustrates the current and/or voltage provided to the set of diodes.

As illustrated in FIG. 22, at a voltage of approximately 1.05 volts, the third-order harmonics generated by the set of diodes drops to approximately −115 dBm. This may indicate that the third-order harmonics generated by the set of diodes is substantially cancelling out the IMD (and/or third order harmonics) generated by a set of FETs coupled to the set of diodes in parallel.

GENERAL COMMENTS

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the disclosure is not intended to be exhaustive or to limit the disclosure to the precise form disclosed above. While specific embodiments of, and examples for, the disclosure are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the disclosure provided herein can be applied to other systems, not necessarily the system described above. The elements and acts of the various embodiments described above can be combined to provide further embodiments.

While certain embodiments of the disclosure have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A radio-frequency switch comprising:
a set of field-effect transistors disposed between a first node and a second node, each field-effect transistor of the set of field-effect transistors having a respective source, drain, gate, and body; and
a compensation circuit coupled in parallel with the set of field-effect transistors, the compensation circuit configured to compensate a non-linearity effect generated by the set of field-effect transistors, the compensation circuit including a first set of diodes coupled antiparallel to a second set of diodes, diodes in the first set of diodes parallel to each other, diodes in the second set of diodes parallel to each other, respective first capacitance directly coupled in series to each of the first set of diodes and respective second capacitance directly coupled in series to each of the second set of diodes, the first set of diodes coupled to a first resistor configured to bias the first set of diodes, the second set of diodes coupled to a second resistor configured to bias the second set of diodes, each of the first resistor and the second resistor coupled in series to a third resistor, the third resistor coupled to a first switch configured to be selectively coupled to a current source when the set of field-effect transistors are in an ON state or to a negative voltage source when the set of field-effect transistors are in an OFF state.

2. The radio-frequency switch of claim 1 wherein the compensation circuit includes a first set of switches coupled in series to the respective first capacitance and the first set of diodes and includes a second set of switches coupled in series to the respective second capacitance and the second set of diodes.

3. The radio-frequency switch of claim 2 wherein the compensation circuit is coupled to a control component configured to control operation of the first set of switches and the second set of switches.

4. The radio-frequency switch of claim 3 wherein the control component is configured to turn the first set of switches and the second set of switches ON when the set of field-effect transistors are in the ON state.

5. The radio-frequency switch of claim 3 wherein the control component is configured to turn the first set of switches and the second set of switches OFF when the set of field-effect transistors are in the OFF state.

6. The radio-frequency switch of claim 2 wherein the compensation circuit includes a first end coupled between the first node and the set of field-effect transistors and a second end coupled between the second node and the set of field-effect transistors.

7. The radio-frequency switch of claim 6 wherein the first set of switches is coupled to the first end and wherein the second set of switches is coupled to the second end.

8. The radio-frequency switch of claim 2 wherein the compensation circuit includes the first switch and the first switch is coupled to the first set of diodes and the second set of diodes.

9. The radio-frequency switch of claim 8 wherein the compensation circuit is coupled to a control component configured to control operation of the first switch.

10. The radio-frequency switch of claim 9 wherein the control component is configured to couple the first switch to the current source when the set of field-effect transistors are in the ON state.

11. The radio-frequency switch of claim 10 wherein the control component is configured to couple the first switch to the negative voltage generator when the set of field-effect transistors are in the OFF state.

12. The radio-frequency switch of claim 1 further comprising one or more resistance elements coupled to the first set of diodes, the second set of diodes, and the first switch.

13. The radio-frequency switch of claim 1 wherein the first node is configured to receive a radio-frequency signal having a power value and the second node is configured to output the radio-frequency signal when the set of field-effect transistors are in the ON state.

14. The radio-frequency switch of claim 13 wherein the set of field-effect transistors includes N field-effect transistors connected in series, the quantity N selected to allow the radio-frequency switch to handle a power of the radio-frequency signal.

15. The radio-frequency switch of claim 1 wherein the compensation circuit is configured to compensate the non-linearity effect by generating harmonics to compensate the non-linearity effect.

16. The radio-frequency switch of claim 1 wherein each of the capacitance is implemented as a capacitor.

17. A radio-frequency switch module comprising:
a packaging substrate configured to receive a plurality of components;
a semiconductor die mounted on the packaging substrate, the semiconductor die including a set of field-effect transistors; and
a compensation circuit coupled in parallel with the set of field-effect transistors, the compensation circuit configured to compensate a non-linearity effect generated by the set of field-effect transistors, the compensation circuit including a first set of diodes coupled antiparallel to a second set of diodes, diodes in the first set of diodes parallel to each other, diodes in the second set of diodes parallel to each other, respective first capacitance directly coupled in series to each of the first set of diodes and respective second capacitance directly coupled in series to each of the second set of diodes, the first set of diodes coupled to a first resistor configured to bias the first set of diodes, the second set of diodes coupled to a second resistor configured to bias the second set of diodes, each of the first resistor and the second resistor coupled in series to a third resistor, the third resistor coupled to a first switch configured to be selectively coupled to a current source when the set of field-effect transistors are in an ON state or to a negative voltage source when the set of field-effect transistors are in an OFF state.

18. A wireless device comprising:
a transceiver configured to process radio-frequency signals;
an antenna in communication with the transceiver configured to facilitate transmission of an amplified radio-frequency signal;
a power amplifier connected to the transceiver and configured to generate the amplified radio-frequency signal; and
a switch connected to the antenna and the power amplifier and configured to selectively route the amplified radio-frequency signal to the antenna, the switch including a set of field-effect transistors, the switch further including a compensation circuit coupled in parallel with the set of field-effect transistors, the compensation circuit configured to compensate a non-linearity effect generated by the set of field-effect transistors, the compensation circuit including a first set of diodes coupled antiparallel to a second set of diodes, diodes in the first set of diodes parallel to each other, diodes in the second set of diodes parallel to each other, respective first capacitance directly coupled in series to each of the first set of diodes and respective second capacitance directly coupled in series to each of the second set of diodes, the first set of diodes coupled to a first resistor configured to bias the first set of diodes, the second set of diodes coupled to a second resistor configured to bias the second set of diodes, each of the first resistor and the second resistor coupled in series to a third resistor, the third resistor coupled to a first switch configured to be selectively coupled to a current source when the set of field-effect transistors are in an ON state or to a negative voltage source when the set of field-effect transistors are in an OFF state.

* * * * *